(12) United States Patent
Chuang et al.

(10) Patent No.: US 9,202,817 B2
(45) Date of Patent: Dec. 1, 2015

(54) SEMICONDUCTOR DEVICE AND METHOD FOR MANUFACTURING THE SAME

(71) Applicant: TAIWAN SEMICONDUCTOR MANUFACTURING CO., LTD., Hsinchu (TW)

(72) Inventors: Harry Hak-Lay Chuang, Singapore (SG); Wei-Cheng Wu, Hsinchu County (TW); Ya-Chen Kao, Taoyuan County (TW)

(73) Assignee: Taiwan Semiconductorr Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/161,372

(22) Filed: Jan. 22, 2014

(65) Prior Publication Data

US 2015/0206891 A1   Jul. 23, 2015

(51) Int. Cl.
*H01L 21/336* (2006.01)
*H01L 27/115* (2006.01)
*H01L 29/423* (2006.01)
*H01L 21/28* (2006.01)

(52) U.S. Cl.
CPC ...... *H01L 27/1157* (2013.01); *H01L 21/28282* (2013.01); *H01L 29/42344* (2013.01)

(58) Field of Classification Search
None
See application file for complete search history.

(56) References Cited

U.S. PATENT DOCUMENTS

2010/0283101 A1* 11/2010 Chen et al. ............... 257/325
2013/0171786 A1*  7/2013 Shroff et al. ............. 438/266

* cited by examiner

*Primary Examiner* — Kyoung Lee
(74) *Attorney, Agent, or Firm* — McDermott Will & Emery LLP

(57) ABSTRACT

The present disclosure provides a semiconductor device and a method for manufacturing the same. The semiconductor device includes a substrate, at least one split gate memory device, and at least one logic device. The split gate memory device is disposed on the substrate. The logic device is disposed on the substrate. At least one of a select gate and a main gate of the split gate memory device and a logic gate of the logic device are made of metal. The method for manufacturing the semiconductor device includes forming at least one split gate stack and at least one logic gate stack and respectively replacing at least one of a dummy gate layer and a main gate layer in the split gate stack and the dummy gate layer in the logic gate stack with at least one metal memory gate and a metal logic gate.

20 Claims, 25 Drawing Sheets

SEMICONDUCTOR DEVICE AND METHOD FOR MANUFACTURING THE SAME

BACKGROUND

Split gate memory devices are typically used as memory devices such as flash memories. Split gate memory devices are memory devices that include transistors having split gates. A control gate and a select gate in a split gate memory device are for program, erase, and read operations. The control gate is used to control programming and erasing of the split gate memory device while the select gate is used to select when the split gate memory device is programmed or read. The use of the separate select gate for the split gate memory device allows for improved isolation and reduced disturbance during programming and reading of the split gate memory device.

Typically, the split gate memory device may further include a gate dielectric film or a tunneling oxide film formed between the select gate and a substrate and an intermediate dielectric film formed between the select gate and the control gate. To operate the split gate memory device, a high voltage may be required.

Split gate memory devices usually operate with input/output (IO) devices or core devices, so the split gate memory devices are usually integrated with the IO devices or the core devices. The integration of the split gate memory devices and the IO devices/core devices is a challenging task.

DETAILED DESCRIPTION

Figure 1:
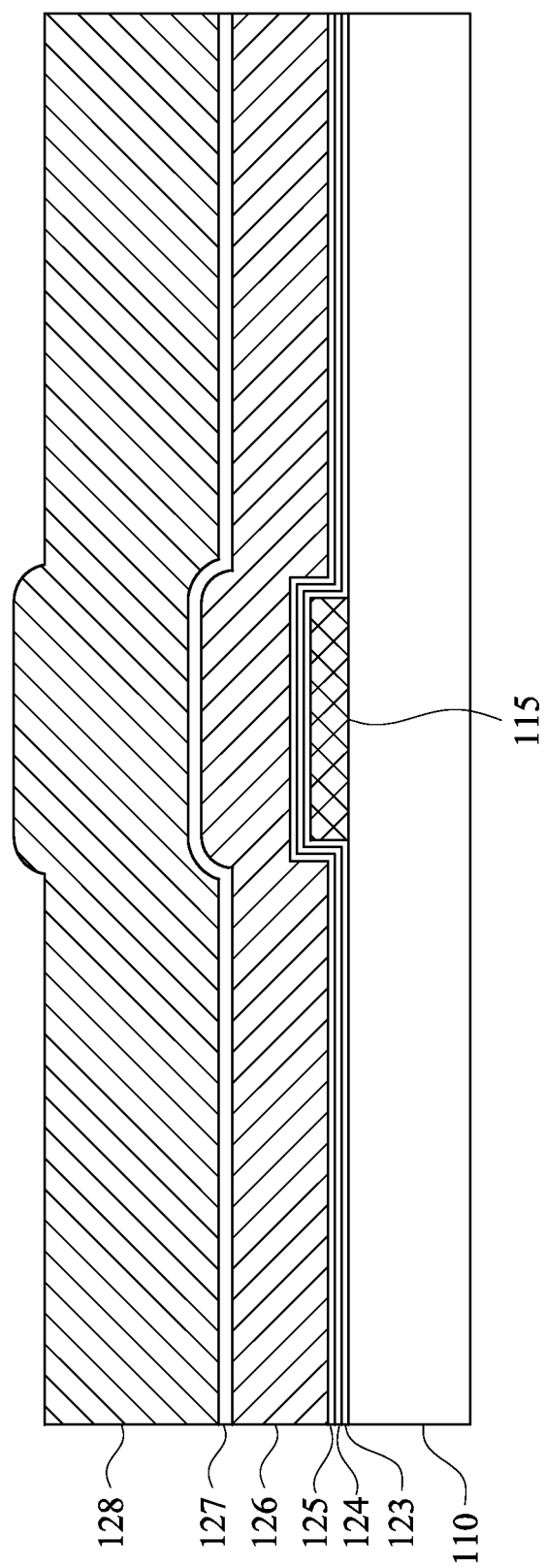
FIGS. 1-18 are cross-sectional views of intermediate steps in forming split gate memory devices and logic devices according to some embodiments of the present disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

As used herein, the terms "comprising," "including," "having," "containing," "involving," and the like are to be understood to be open-ended, i.e., to mean including but not limited to.

The singular forms "a," "an" and "the" used herein include plural referents unless the context clearly dictates otherwise. Therefore, reference to, for example, a dielectric layer includes embodiments having two or more such dielectric layers, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

A memory device may be embedded in a semiconductor device, such as a system on chip (SoC). In order to miniaturize the semiconductor devices, embedding memory devices in high-κ/metal gate (HK/MG) devices may be a strategy to miniaturize a combination of the HK/MG devices and the memory devices. However, because the HK/MG devices and the memory devices are formed separately, the associated process needs many masks, increasing difficulties and costs of the process. In addition, dummy structures disposed between the HK/MG devices and the memory devices are needed in such process, leading to an increased size of the devices.

According to various embodiments of the present disclosure, a method for manufacturing a semiconductor device is provided. In some embodiments, the method involves a gate-last HK/MG process. In the embodiments, at least one split gate stack and at least one logic gate stack are formed first, and then a replacement polysilicon gate (RPG) loop is performed. As a result, the gates of the split gate stack and the logic gate stack are replaced with metal gates by using the same mask, and thus the masks used in the method are reduced compared to a sequential process, that is, individually forming memory devices and logic devices.

According to various embodiments of the present disclosure, memory devices formed in the method constitute a non-volatile memory. In some embodiments, the memory devices constitute a flash memory, and the gate structures of the memory devices are split gate structures.

Figure 2:
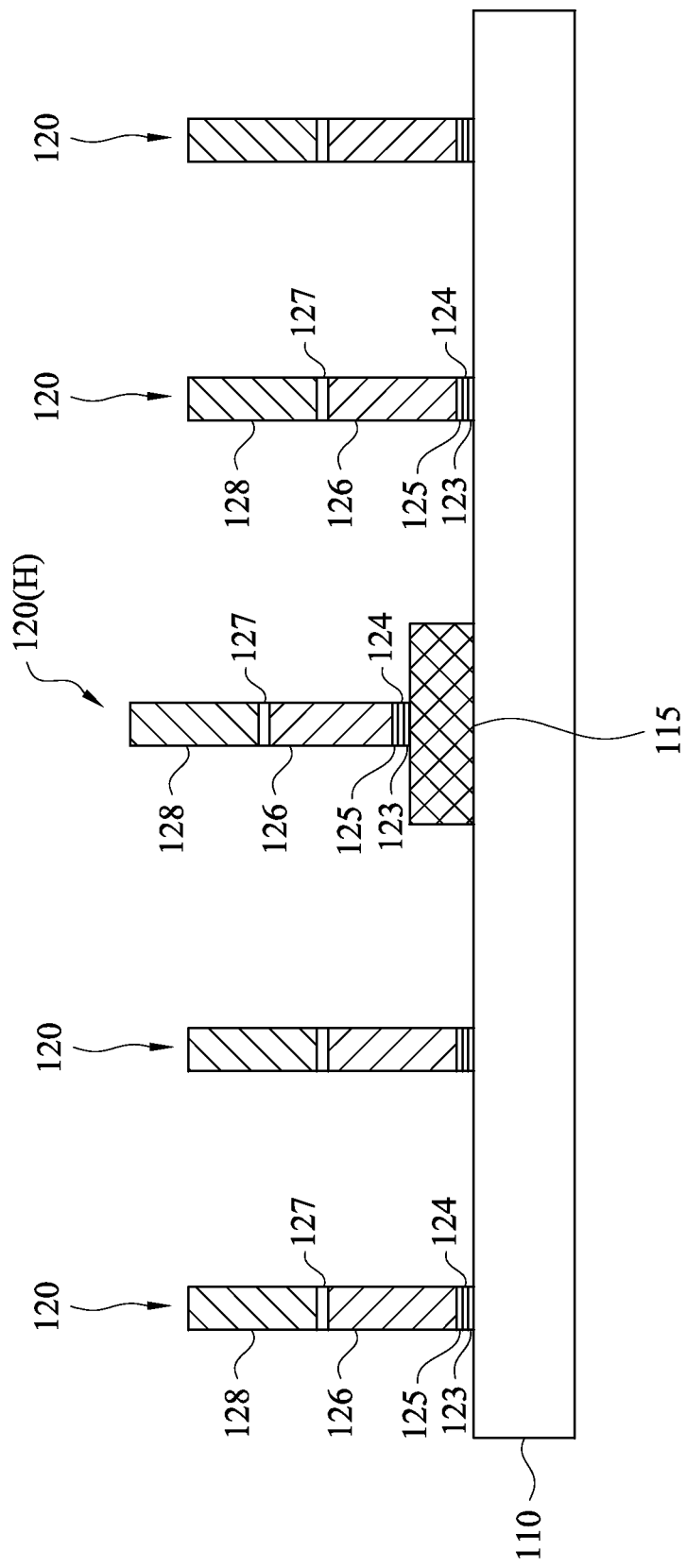

FIGS. 1-18 are cross-sectional views of intermediate steps in forming split gate memory devices and logic devices according to some embodiments of the present disclosure. FIGS. 1-2 are cross-sectional views illustrating gate formation according to some embodiments of the present disclosure. As shown in FIG. 1, a high voltage oxide layer 115 is formed on or above a substrate 110, and then an intermediate dielectric layer 123 is formed on or above the substrate 110. Then, a high-κ dielectric layer 124, a barrier layer 125, a dummy gate layer 126, a buffer layer 127, and a hard mask layer 128 are sequentially formed on or above the intermediate dielectric layer 123. One function of the barrier layer 125 is to prevent layers below the barrier layer 125, such as the high-κ dielectric layer 124, from reacting with a metal gate which will be formed in the subsequent processes, and another function of the barrier layer 125 is to adjust a band edge effective work function of the metal gate. The function of the buffer layer 127 is to protect the dummy gate layer 126 from oxidation when the hard mask layer 128 is oxidized.

As shown in FIG. 2, the hard mask layer 128, the buffer layer 127, the dummy gate layer 126, the barrier layer 125, the high-κ dielectric layer 124, and the intermediate dielectric layer 123 are patterned to form gate stacks 120 on or above the substrate 110.

In some embodiments, the intermediate dielectric layer 123 is made of a dielectric material, such as silicon dioxide ($SiO_2$) or silicon oxynitride (SiON). The high voltage oxide layer 115 is made of, for example, silicon dioxide ($SiO_2$). The high-κ dielectric layer 124 is made of a high-κ dielectric material, such as hafnium oxide ($HfO_x$), lanthanum monoxide (LaO), aluminum monoxide (AlO), aluminum oxide ($Al_2O_3$), zirconium monoxide (ZrO), titanium monoxide (TiO), tantalum pentoxide ($Ta_2O_5$), strontium titanate ($SrTiO_3$), barium titanate ($BaTiO_3$), hafnium silicate (HfSiO), lanthanum silicate (LaSiO), aluminum silicate (AlSiO), or hafnium titanate (HfTiO). The barrier layer 125 is made of, for example, titanium nitride (TiN) or tantalum nitride (TaN). The dummy gate layer 126 is made of, for example, polycrystalline silicon (Si). The buffer layer 127 is made of, for example, silicon nitride (SiN). The hard mask layer 128 is made of, for example, silicon dioxide ($SiO_2$) or silicon oxynitride (SiON). The substrate 110 is made of a semiconductor, such as silicon (Si), gallium arsenide (GaAs), or silicon-on-insulator (SoI).

The gate stacks 120 and line-ends (not shown) are defined by at least one mask, and the gate formation is performed through deposition and masking processes. In addition, the high voltage oxide layer 115, the intermediate dielectric layer 123, the high-κ dielectric layer 124, the barrier layer 125, the dummy gate layer 126, the buffer layer 127, and the hard mask layer 128 may be formed by deposition processes, such as chemical vapor deposition (CVD), plasma enhanced chemical vapor deposition (PECVD), or other deposition processes.

In some embodiments, the thickness of the high voltage oxide layer 115 is in a range from about 40 nm to about 60 nm. The thickness of the intermediate dielectric layer 123 is in a range from about 1 nm to about 2 nm. The thickness of the high-κ dielectric layer 124 is in a range from about 1 nm to about 3 nm. The thickness of the barrier layer 125 is in a range from about 1 nm to about 3 nm. The thickness of the dummy gate layer 126 is in a range from about 60 nm to about 70 nm. The thickness of the buffer layer 127 is in a range from about 5 nm to about 15 nm. The thickness of the hard mask layer 128 is in a range from about 100 nm to about 120 nm.

Furthermore, at least one of the gate stacks 120 is formed on or above the high voltage oxide layer 115 as a high voltage device gate stack H. The high voltage device gate stack H is used to be a gate stack of a high voltage device, and the high voltage device is used to be the power device of the semiconductor device 100.

Figure 3:
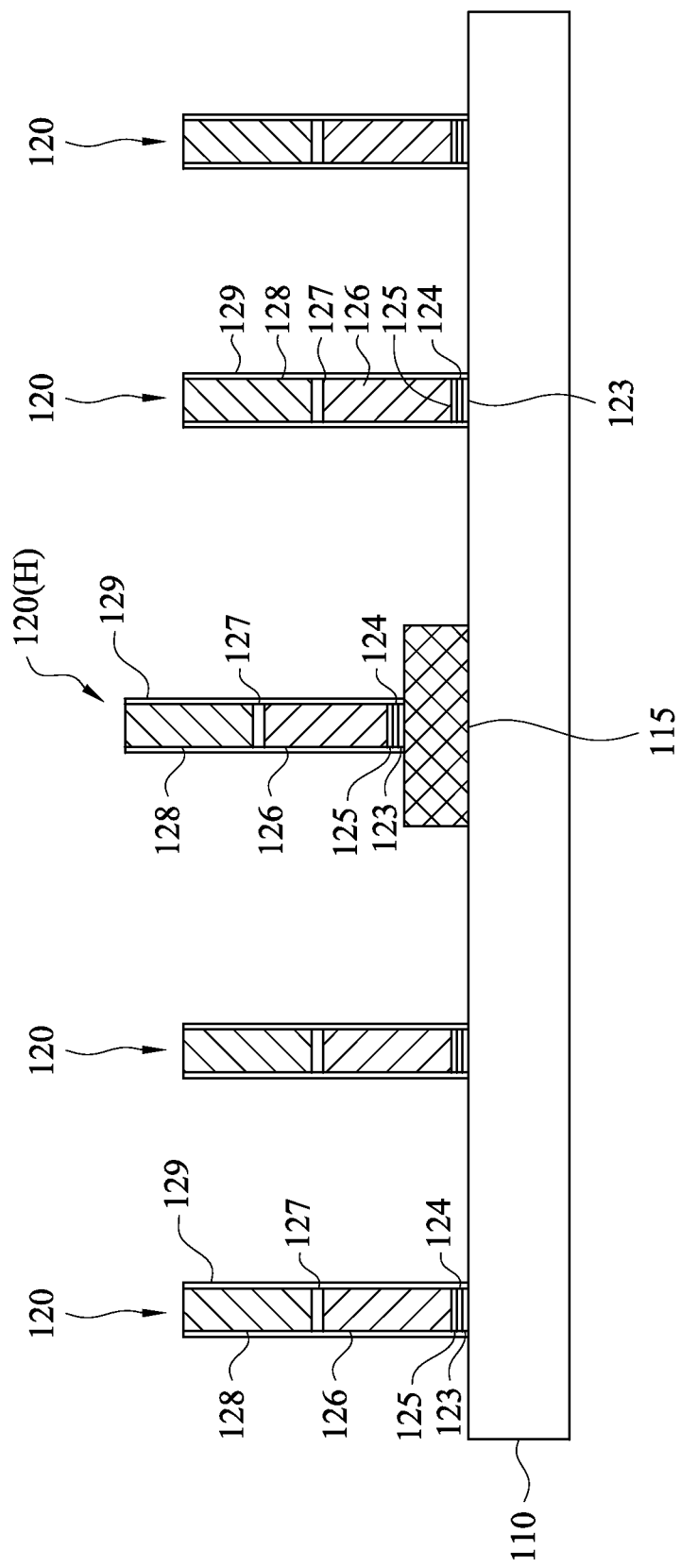

FIG. 3 is a cross-sectional view illustrating seal formation according to some embodiments of the present disclosure. As shown in FIG. 3, a first seal layer 129 is formed around each of the gate stacks 120. This may be achieved by forming a dielectric layer on or above the substrate 110 and the gate stacks 120 and then anisotropically etching the dielectric layer to form the first seal layer 129 around each of the gate stacks 120.

In some embodiments, the first seal layer 129 is made of a dielectric material, such as silicon nitride (SiN). The thickness of the first seal layer 129 is in a range from about 3 nm to about 7 nm. In addition, the dielectric layer etched to form the first seal layer 129 may be formed by a deposition process, such as chemical vapor deposition (CVD), plasma enhanced chemical vapor deposition (PECVD), or other deposition processes.

Figure 4:
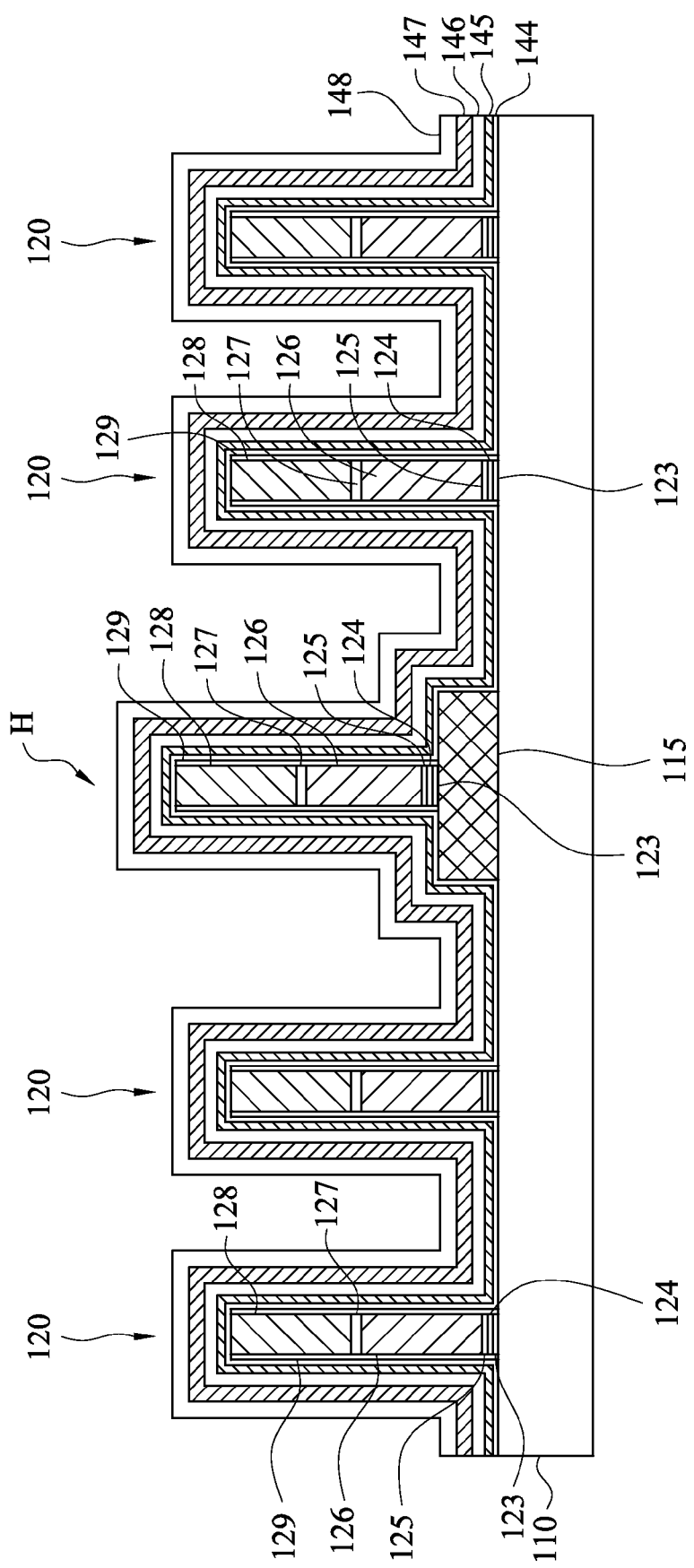

FIGS. 4-11 are cross-sectional views illustrating device formation according to some embodiments of the present disclosure. As shown in FIG. 4, a tunneling layer 144 is formed on or above the substrate 110 through atomic layer deposition (ALD). Then, post-nitridation annealing is performed by in situ steam generation. Then, a charge trapping layer 145 is formed on or above the tunneling layer 144. This may be achieved by forming an amorphous silicon layer on or above the tunneling layer 144 and then annealing the amorphous silicon layer to form the charge trapping layer 145.

Then, a blocking layer 146 is formed on or above the charge trapping layer 145 through high temperature oxidation, and then the blocking layer 146 is annealed. Then, a main gate layer 147 is formed on or above the blocking layer 146. Then, a spacer layer 148 is formed on or above the main gate layer 147. The function of the charge trapping layer 145 is to store electrons so as to store information. The function of the tunneling layer 144 and the blocking layer 146 is to isolate the charge trapping layer 145. The tunneling layer 144 is the layer which high energy electrons jump through.

In some embodiments, the tunneling layer 144 is made of a dielectric material, such as silicon dioxide ($SiO_2$) or silicon oxynitride (SiON). The blocking layer 146 is made of a dielectric material, such as silicon dioxide ($SiO_2$) or silicon oxynitride (SiON). The charge trapping layer 145 is made of, for example, silicon nitride (SiN), silicon doped silicon nitride, or a silicon layer with nano-crystal dots. The main gate layer 147 is made of, for example, polycrystalline silicon (Si) or metal doped polycrystalline silicon. The spacer layer 148 is made of, for example, silicon nitride (SiN).

The charge trapping layer 145, the main gate layer 147, and the spacer layer 148 may be formed by deposition processes, such as chemical vapor deposition (CVD), plasma enhanced chemical vapor deposition (PECVD), or other deposition processes.

In some embodiments, the thickness of the tunneling layer 144 is in a range from about 2 nm to about 7 nm. The thickness of the charge trapping layer 145 is in a range from about 5 nm to about 15 nm. The thickness of the blocking layer 146 is in a range from about 5 nm to about 15 nm. The thickness of the main gate layer 147 is in a range from about 20 nm to about 30 nm. The thickness of the spacer layer 148 is in a range from about 20 nm to about 30 nm.

Figure 5:
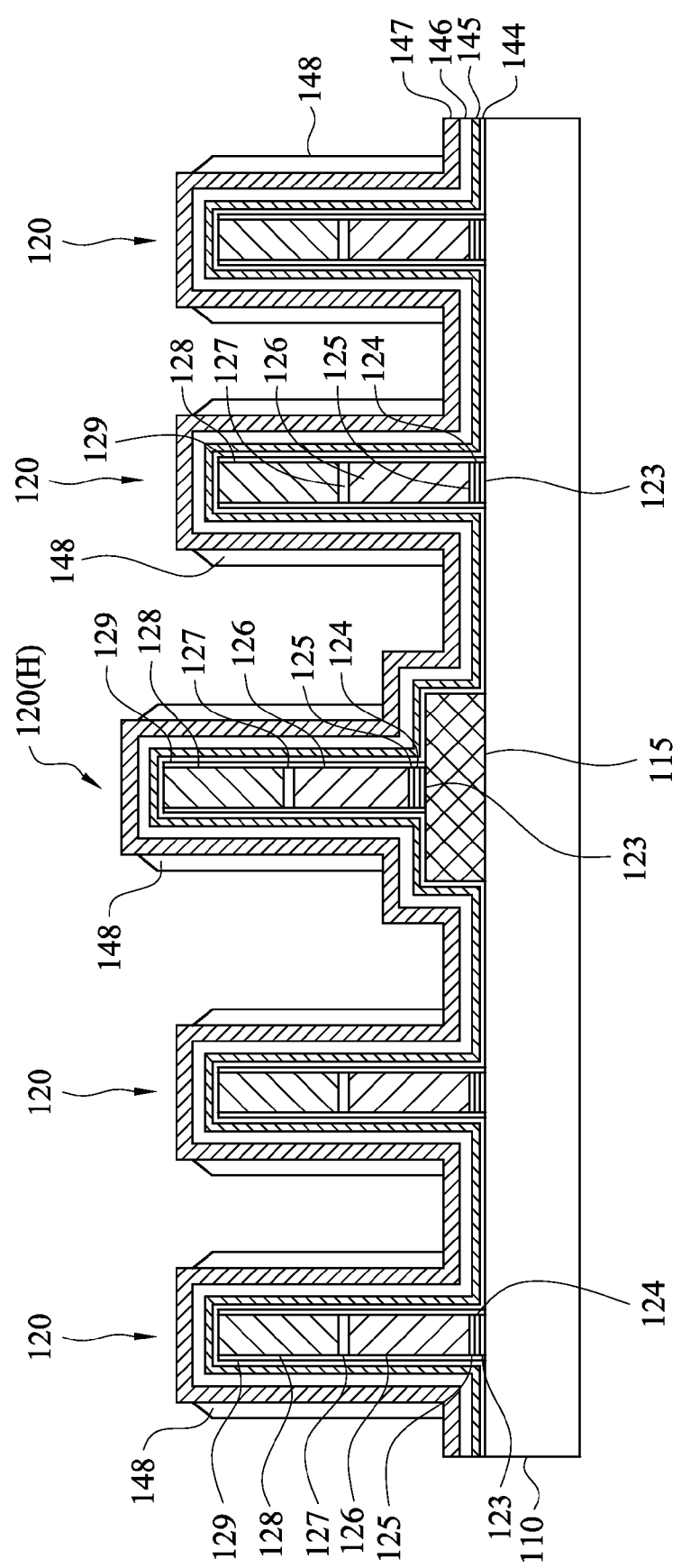
Figure 6:
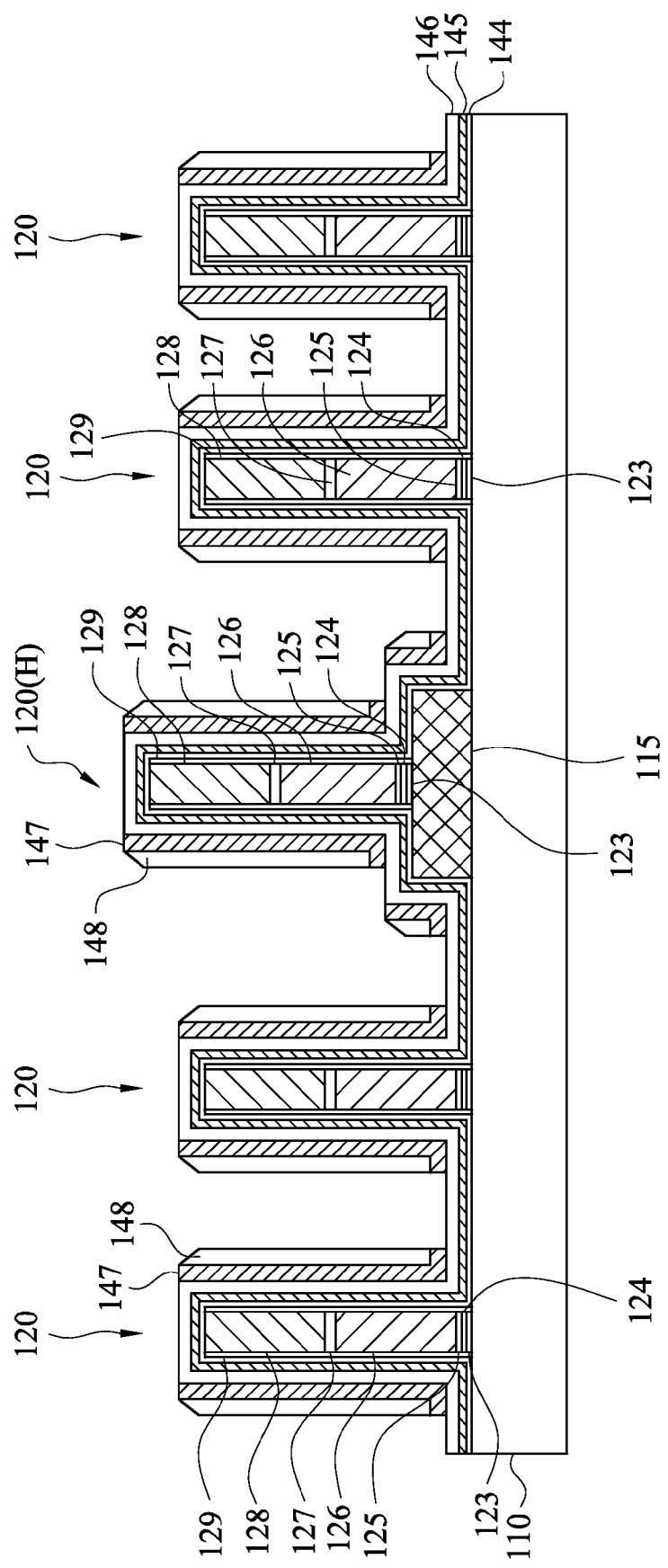

As shown in FIG. 5, the spacer layer 148 is etched into spacers. Then, as shown in FIG. 6, a portion of the main gate layer 147 exposed by the spacer layer 148 is dry etched, such that the remaining main gate layer 147 is disposed between the spacer layer 148 and the blocking layer 146.

Figure 7:
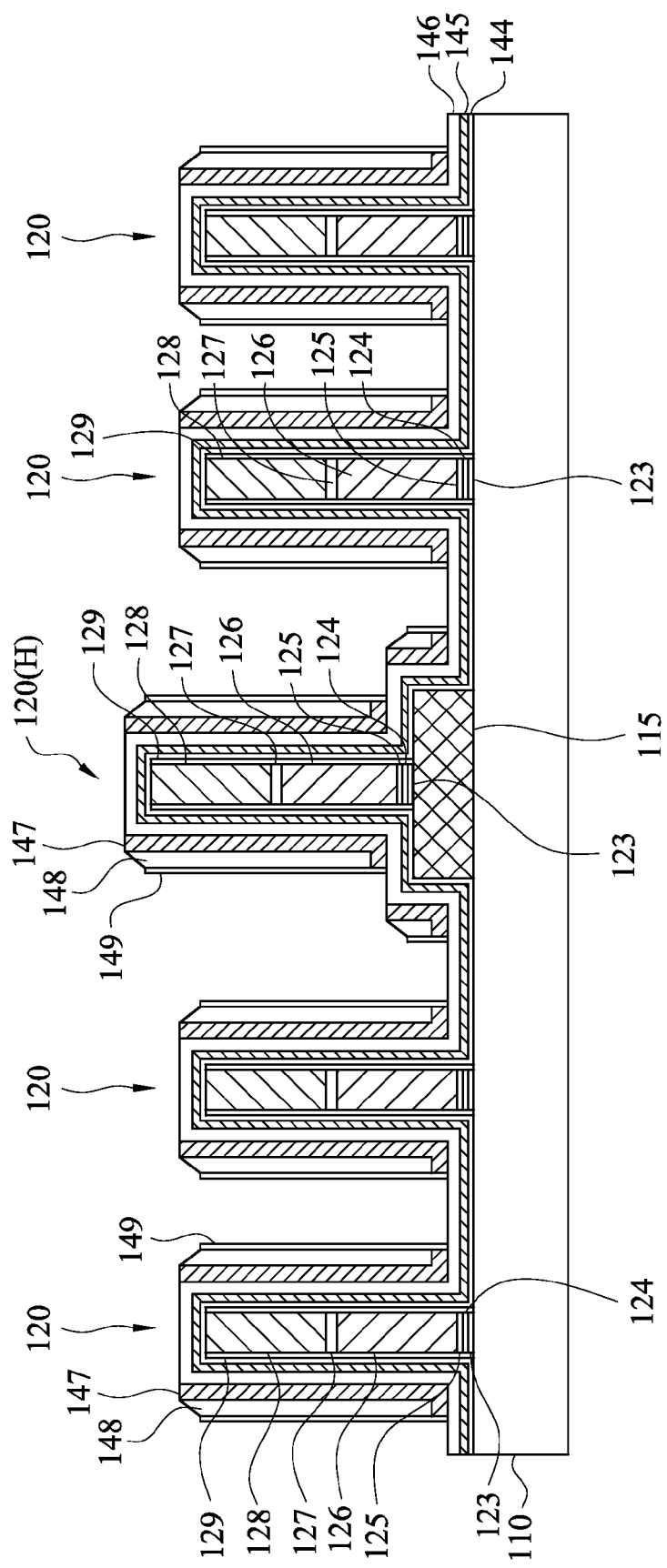

As shown in FIG. 7, a second seal layer 149 is formed adjacent to the main gate layer 147 and the spacer layer 148 to cover a surface of the main gate layer 147 exposed by the spacer layer 148. This may be achieved by forming a dielectric layer on or above the substrate 110 and then anisotropically etching the dielectric layer to form the second seal layer 149.

In some embodiments, the second seal layer 149 is made of, for example, silicon nitride (SiN). The thickness of the second seal layer 149 is in a range from about 2 nm to about 7 nm. Furthermore, the dielectric layer etched to form the second seal layer 149 may be formed by a deposition process, such as chemical vapor deposition (CVD), plasma enhanced chemical vapor deposition (PECVD), or other deposition processes.

Figure 8:
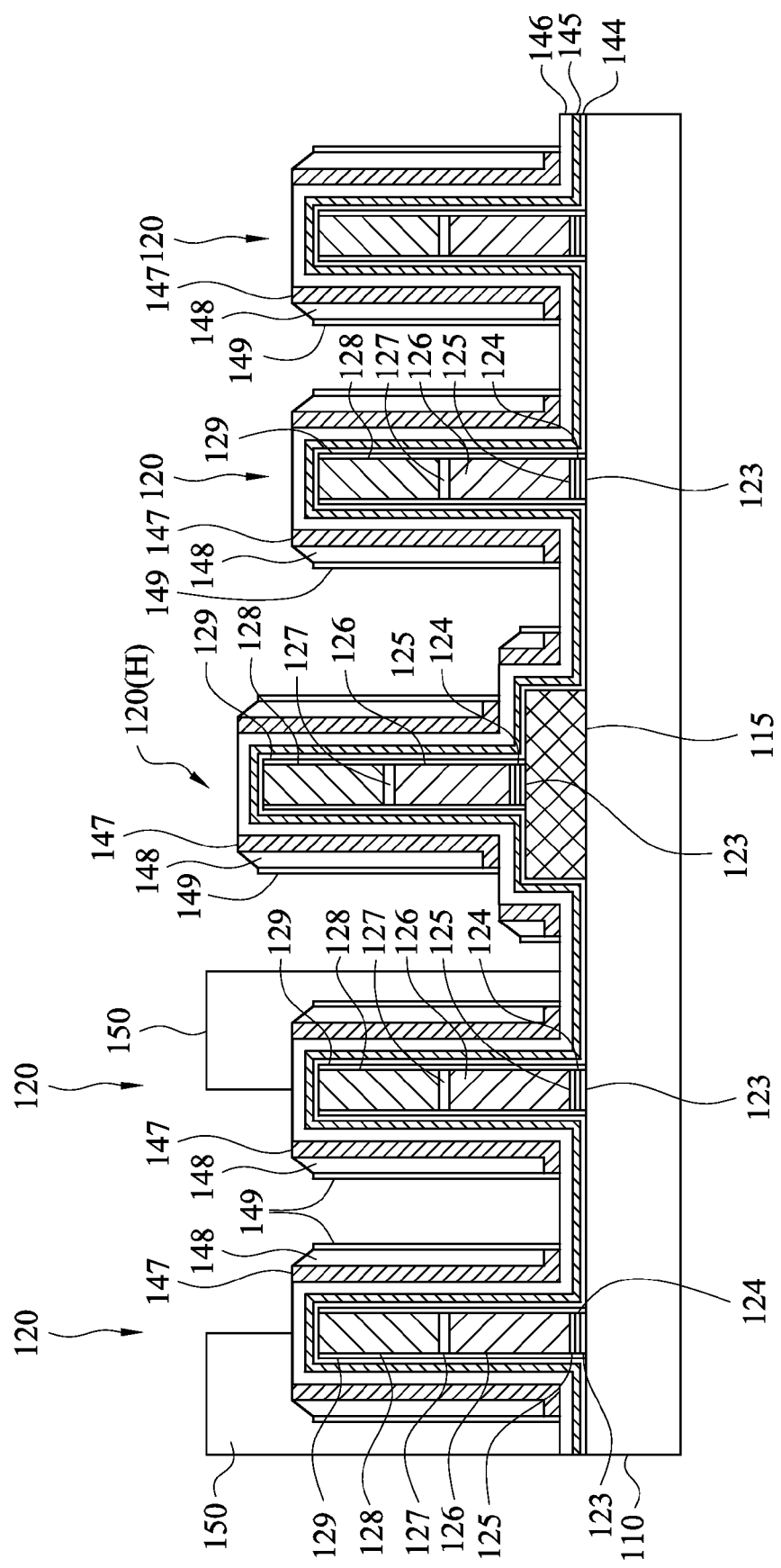
Figure 9:
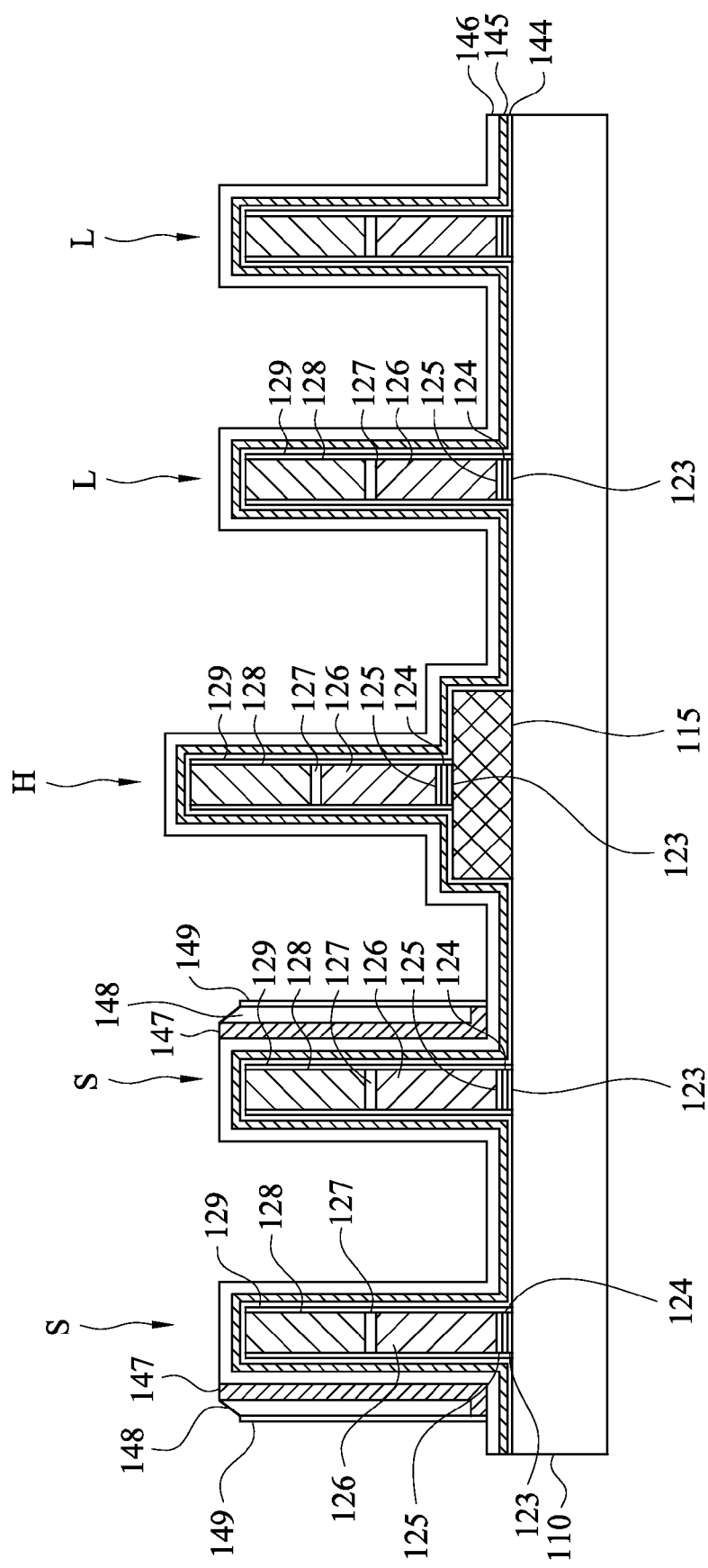

As shown in FIG. 8, a photoresist 150 is formed to cover drain side regions of split gate stacks. Then, as shown in FIG. 9, the second seal layer 149, the spacer layer 148, and the main gate layer 147 outside the drain side regions is removed by chemical dry etching, such that the gate stacks 120 having the drain side regions become split gate stacks S, and the remaining gate stacks 120 can be considered logic gate stacks L. Then, the photoresist 150 is removed.

Figure 10:
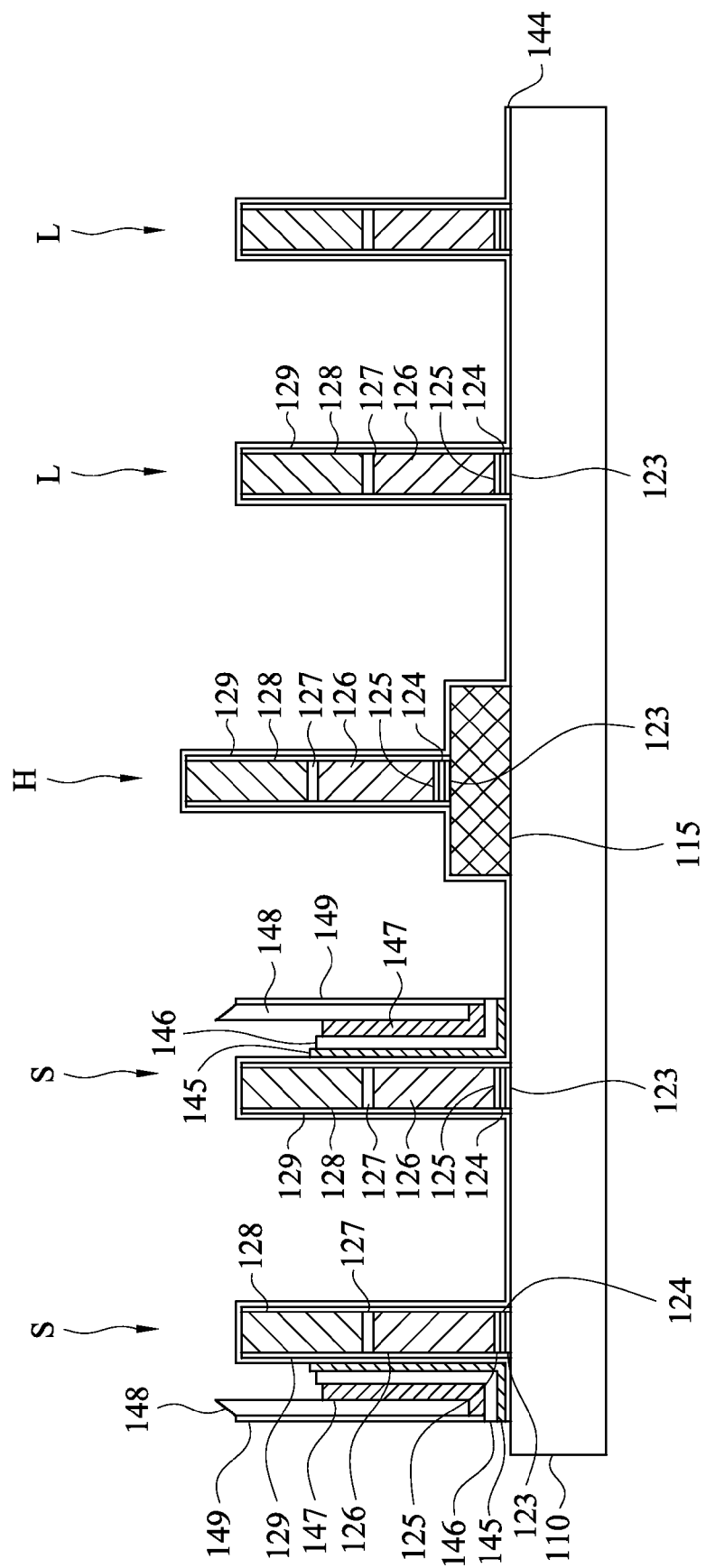

As shown in FIG. 10, the blocking layer 146 is partially removed by a wet process. The charge trapping layer 145 and the main gate layer 147 are partially removed by chemical dry etching.

Figure 11:
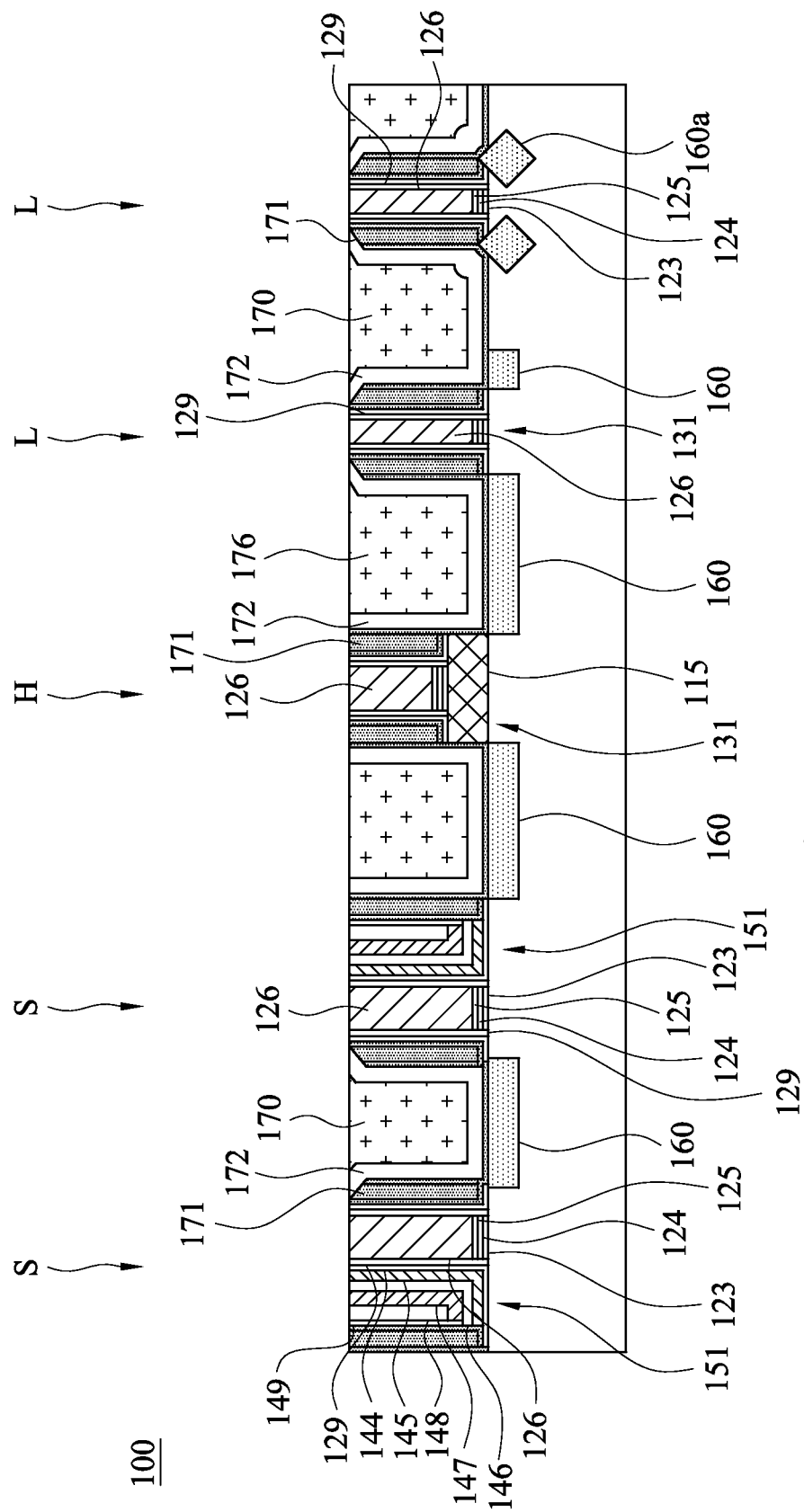

As shown in FIG. 11, the tunneling layer 144 is partially removed by a wet process. Sources and drains 160 are formed corresponding to the logic gate stacks L, the high voltage device gate stack H, and the split gate stacks S. The sources and drains 160 may be formed by implanting ions into the substrate 110 and then optionally performing a further process, such as a silicide process, to reduce contact resistance. Then, a sidewall spacer 171 is formed around the logic gate stacks L, the high voltage device gate stack H, and the split gate stacks S. The sidewall spacer 171 may include a plurality of layers. Then, a contact etch stop layer 172 is formed on the sources and drains 160. Then, an interlayer dielectric layer 170 is formed on or above the contact etch stop layer 172. Then, the semiconductor device 100 of FIG. 11 is planarized.

In some embodiment, the sources and drains 160 are made of, for example, germanium silicide (SiGe), silicon carbide (SiC), nickel silicide (NiSi), cobalt silicide (CoSi), or titanium silicide (TiSi). The interlayer dielectric layer 170 is made of, for example, phosphosilicate glass (PSG) or borophosphosilicate glass (BPSG). The sidewall spacer 171 is made of, for example, dielectric materials, such as nitride or arsenide. The contact etch stop layer 172 is made of, for example, silicon nitride (SiN) or silicon oxynitride (SiON).

In some embodiments, the interlayer dielectric layer 170, the sidewall spacer 171, and the contact etch stop layer 172 may be formed by deposition processes, such as chemical vapor deposition (CVD), plasma enhanced chemical vapor deposition (PECVD), or other deposition processes.

At least one memory channel 151 is formed under the split gate stacks S. At least one logic channel 131 is formed under the high voltage device gate stack H. At least one logic channel 131 is formed under the logic gate stacks L.

In FIG. 11, the rightmost logic gate stack L is a schematic representation of a logic gate stack L intended to form a pMOSFET logic device, and the second right logic gate stack L is a schematic representation of a logic gate stack L intended to form an nMOSFET logic device. The reference number 160a indicates the source and drain of the pMOSFET logic device. The material of the source and drain 160a is germanium silicide (SiGe), nickel silicide (NiSi), cobalt silicide (CoSi), or titanium silicide (TiSi). A part of the source and drain 160a is disposed on or above the substrate 110. The formation of the source and drain 160a involves additional processes that are not described hereinafter.

The planarization of this disclosure, if not specified, is chemical mechanical polishing.

In some embodiments, at least one of the dummy gate layer 126 and the main gate layer 147 in the split gate stacks S is replaced with at least one metal memory gate, such as at least one P-metal memory gate or at least one N-metal memory gate, and the dummy gate layer 126 in the high voltage device gate stack H and/or the logic gate stacks L is replaced with at least one metal logic gate, such as at least one P-metal logic gate or at least one N-metal logic gate.

Figure 12:
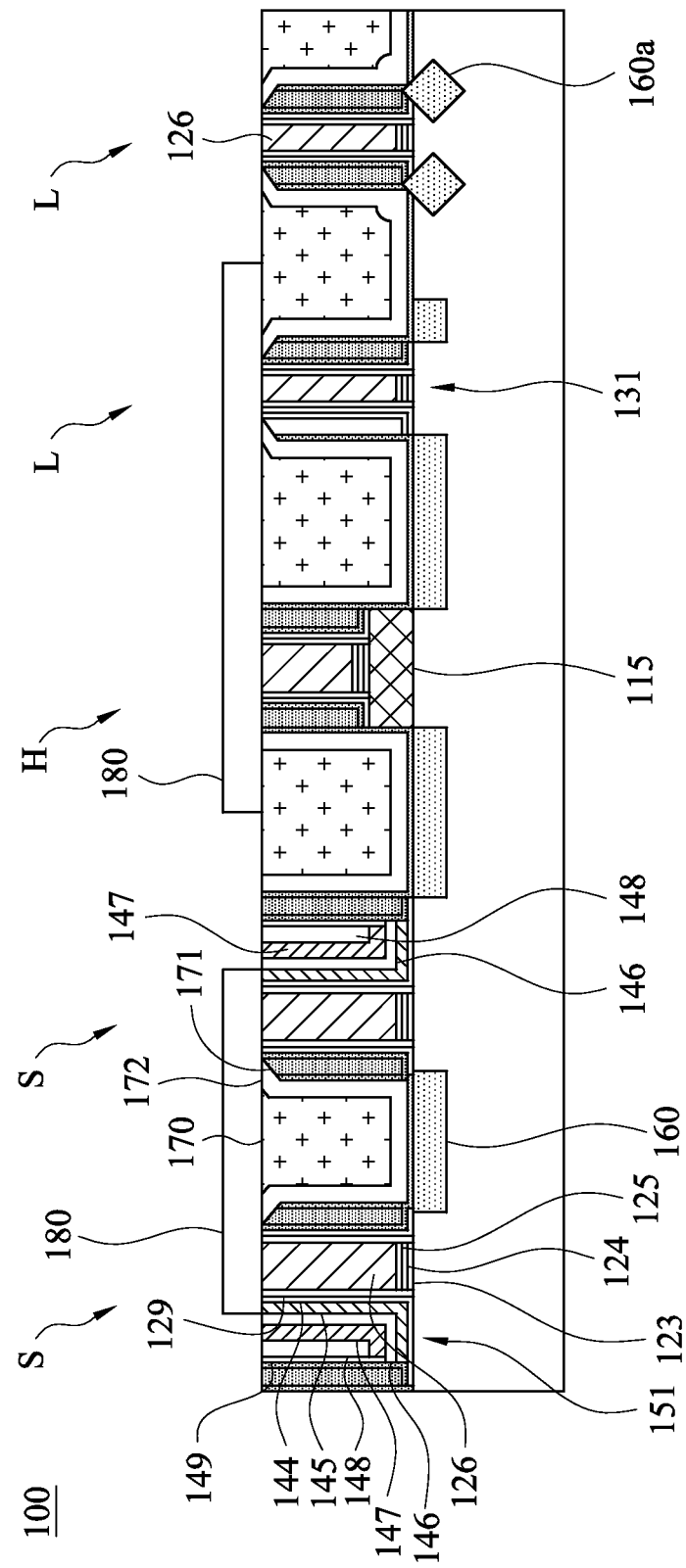

FIGS. 12-18 are cross-sectional views of intermediate steps in the RPG loop according to some embodiments of the present disclosure. As shown in FIG. 12, a photomask 180 is formed on or above the semiconductor device 100 of FIG. 11. The dummy gate layer 126 in at least one of the logic gate stacks L and the main gate layer 147 in at least one of the split gate stack S are exposed by the photomask 180.

Figure 13:
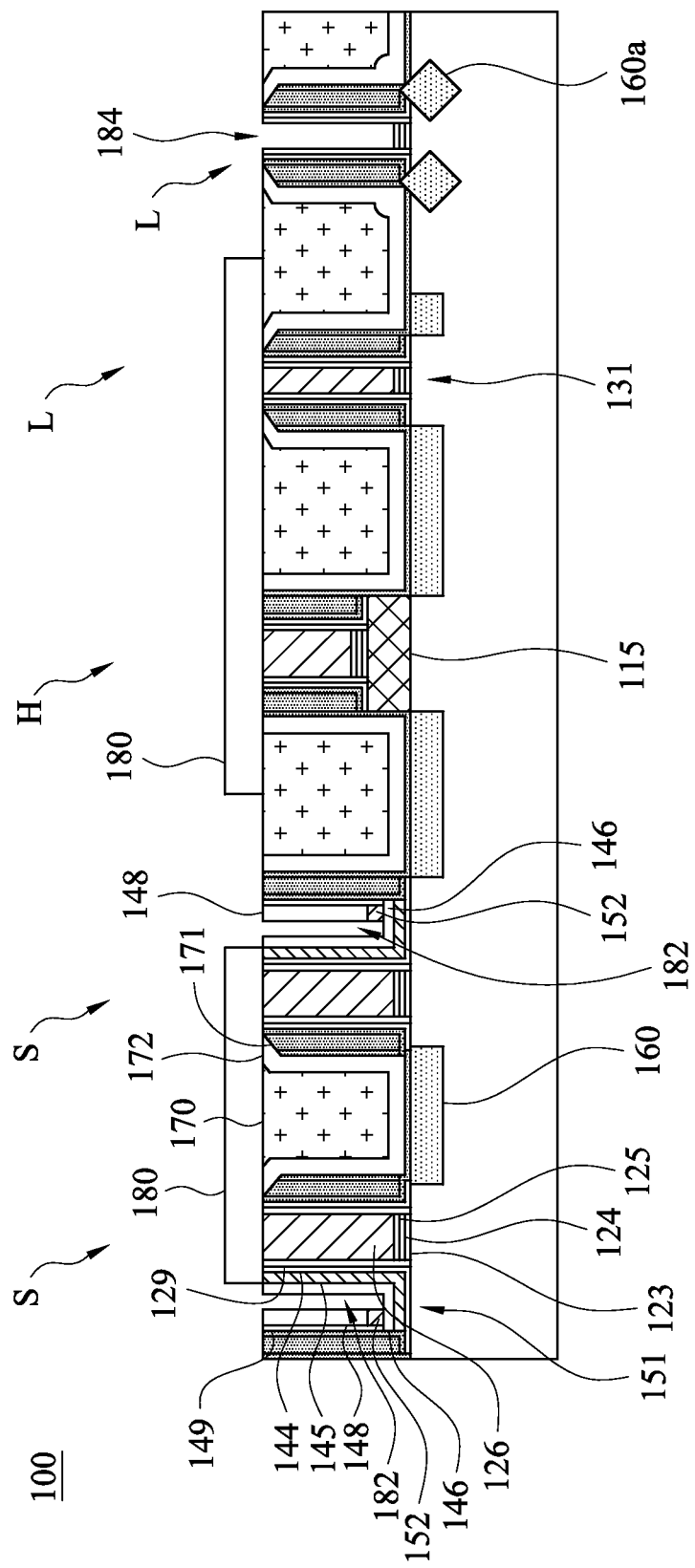

As shown in FIG. 12 and FIG. 13, the exposed dummy gate layer 126 and the exposed main gate layer 147 are removed to form at least one main gate opening 182 (the main gate opening 182 can also be considered a memory gate opening) in the split gate stacks S and at least one logic gate opening 184 in the logic gate stacks L. Furthermore, since the exposed main gate layer 147 is removed by etching, a part of the main gate layer 147 remains between the spacer layer 148 and the blocking layer 146. The part of the main gate layer 147 remaining between the spacer layer 148 and the blocking layer 146 may be considered a silicon residue 152 when the main gate layer 147 is made of silicon.

Figure 14:
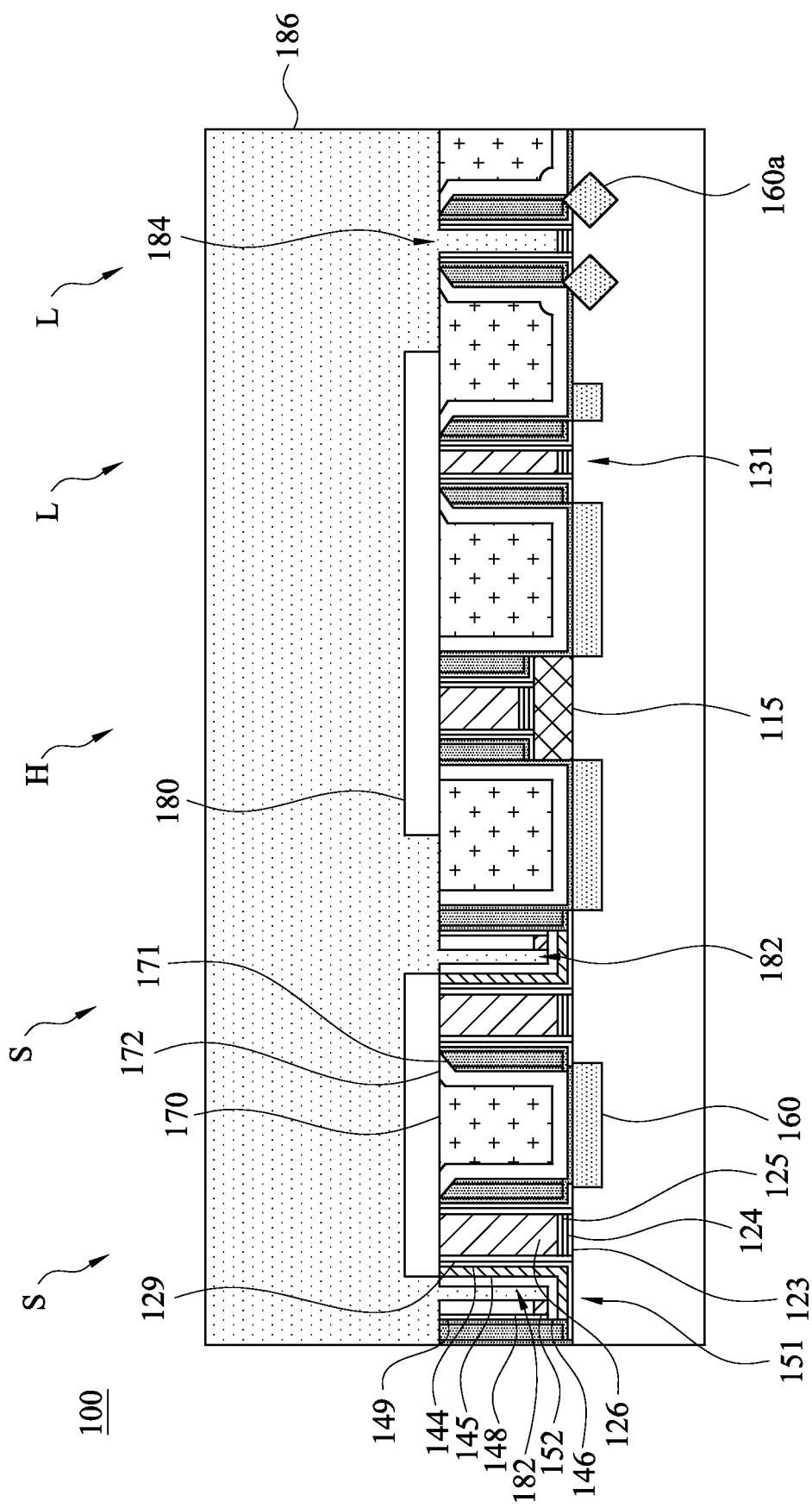

As shown in FIG. 14, a P-metal layer 186 is formed on or above the semiconductor device 100, such that the main gate opening 182 and the logic gate opening 184 are filled with the P-metal layer 186. Then, as shown in FIG. 15, the semiconductor device 100 is planarized, and the P-metal layer 186 outside the main gate opening 182 and the logic gate opening 184 are removed.

Figure 15:
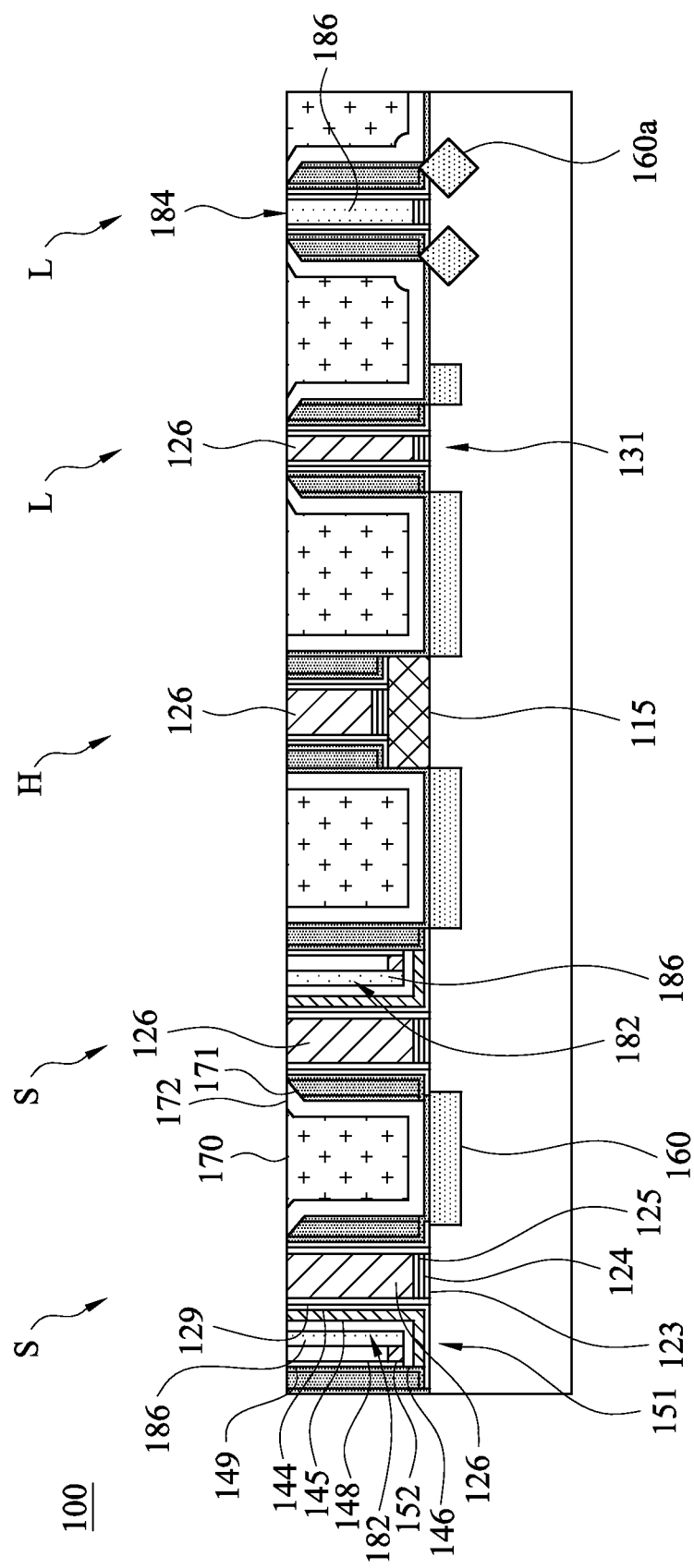
Figure 16:
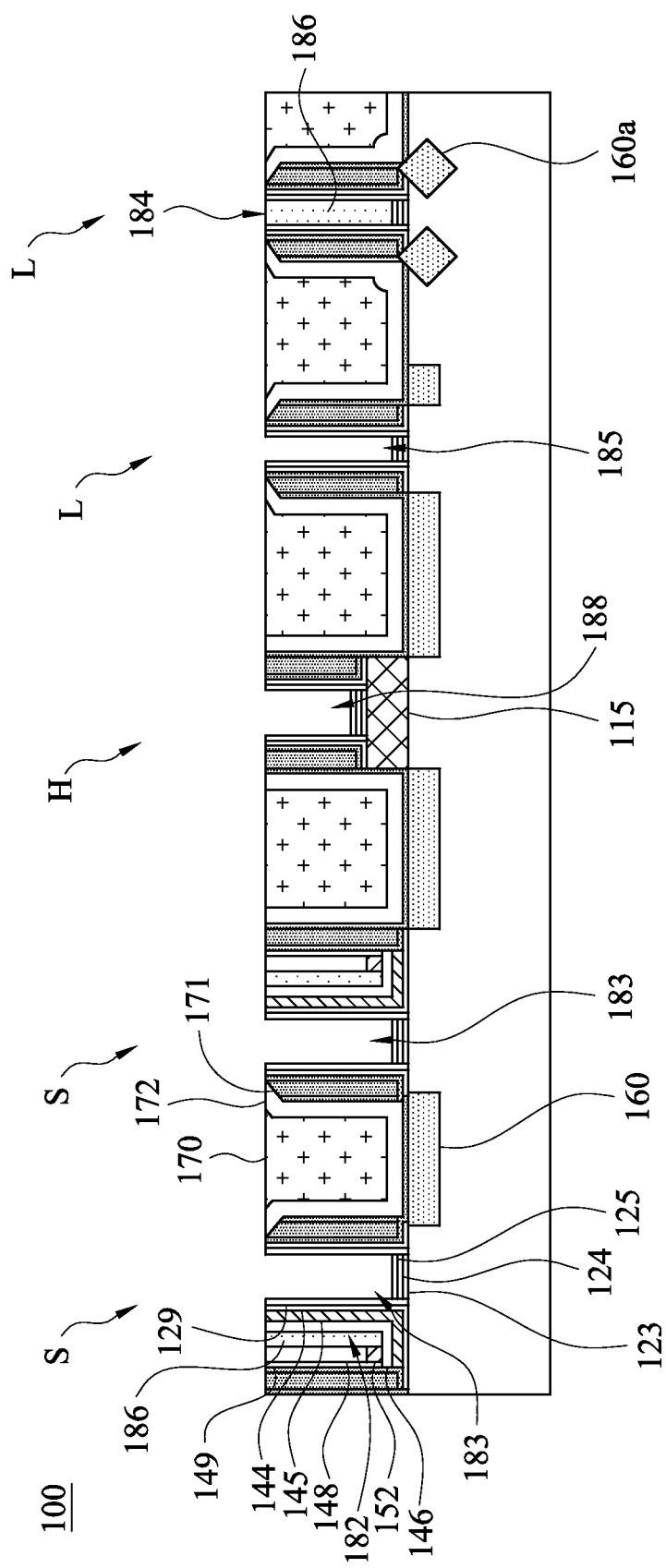

As shown in FIG. 15 and FIG. 16, the dummy gate layer 126 in at least one of the logic gate stacks L, the dummy gate layer 126 in at least one of the split gate stacks S, and the dummy gate layer 126 in the high voltage device gate stack H are removed to form at least one select gate opening 183 (the select gate opening 183 can also be considered a memory gate opening) in the split gate stacks S, at least one logic gate opening 185 in the logic gate stacks L, and at least one high voltage device gate opening 188 in the high voltage device gate stack H.

Figure 17:
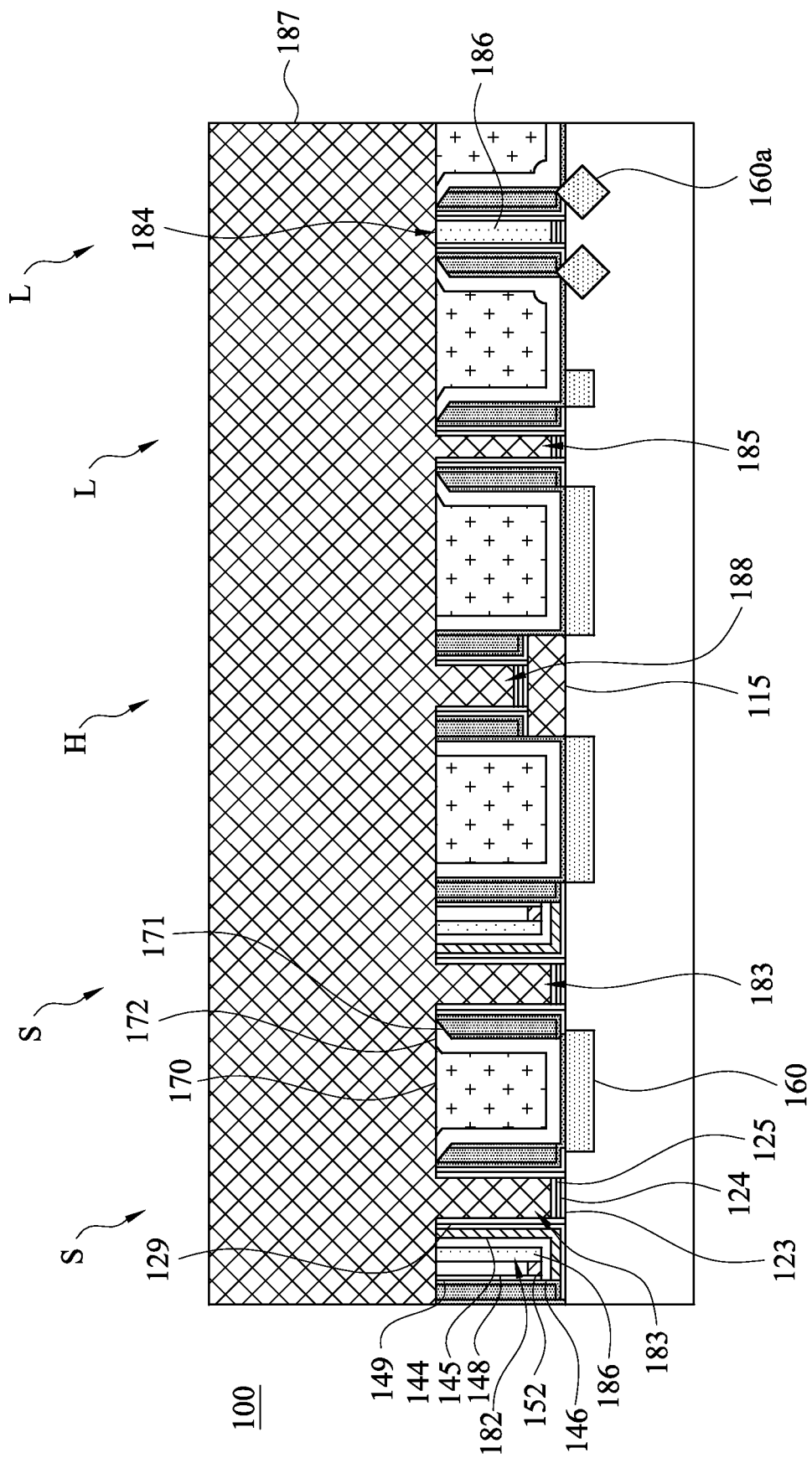
Figure 18:
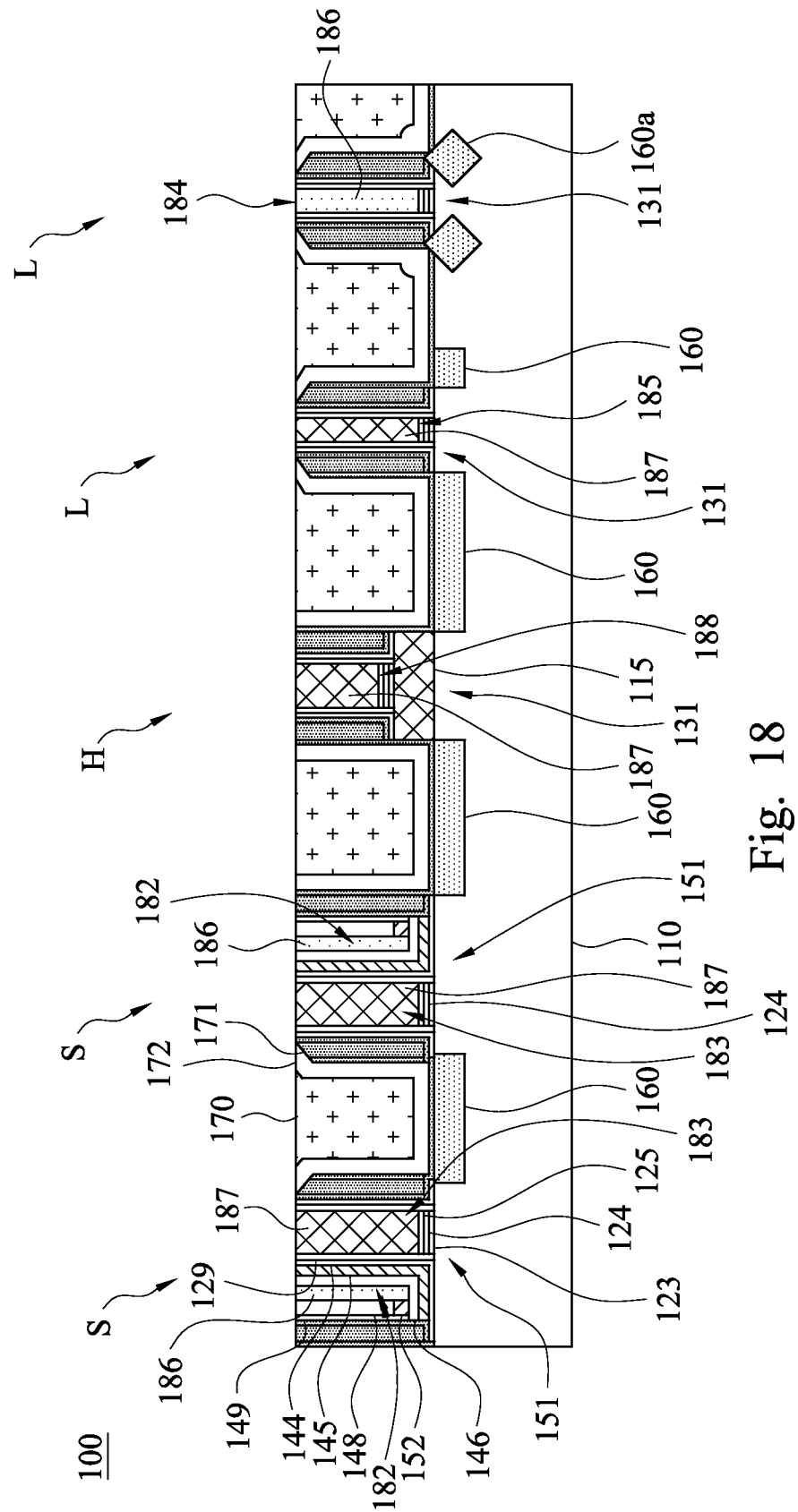

As shown in FIG. 17, an N-metal layer 187 is formed on or above the semiconductor device 100, such that the select gate opening 183, the logic gate opening 185, and the high voltage device gate opening 188 are filled with the N-metal layer 187. Then, as shown in FIG. 18, the semiconductor device 100 is planarized, and the N-metal layer 187 outside the select gate opening 183, the logic gate opening 185, and the high voltage device gate opening 188 are removed. Then, interconnect processes are performed. The detailed information about the interconnect processes is not described hereinafter.

The P-metal layer 186 is made of a metal compound with a band edge effective work function larger than 4.9 eV, such as titanium nitride (TiN), and the N-metal layer 187 is made of a metal compound with a band edge effective work function smaller than 4.1 eV, such as titanium aluminium nitride (TiAlN).

In some embodiment, the P-metal layer 186 and the N-metal layer 187 may be formed by deposition processes, such as chemical vapor deposition (CVD), physical vapor deposition (PVD), atomic layer deposition (ALD), or other deposition processes.

As shown in FIG. 18, the split gate stacks S with the corresponding memory channels 151, sources, and drains 160 can now be considered split gate memory devices. The logic gate stacks L with the corresponding logic channel 131, sources, and drains 160 can now be considered logic devices. The high voltage device gate stack H with the corresponding logic channel 131, sources, and drains 160 can now be considered a high voltage device. The P-metal layer 186 in the main gate openings 182 can be considered main gates, the N-metal layers 187 in the select gate openings 183 can be considered select gates, and the P-metal layer 186 and N-metal layers 187 in the logic gate openings 184 and 185 and the high voltage device gate opening 188 can be considered logic gates.

In FIG. 18, the rightmost logic device is a pMOSFET, and the main gates of the split gate memory devices and the logic gate of the rightmost logic device are made of P-metal. The second right logic device is an nMOSFET, and the select gates of the split gate memory devices and the logic gate of the second right logic device are made of N-metal.

Figure 19:
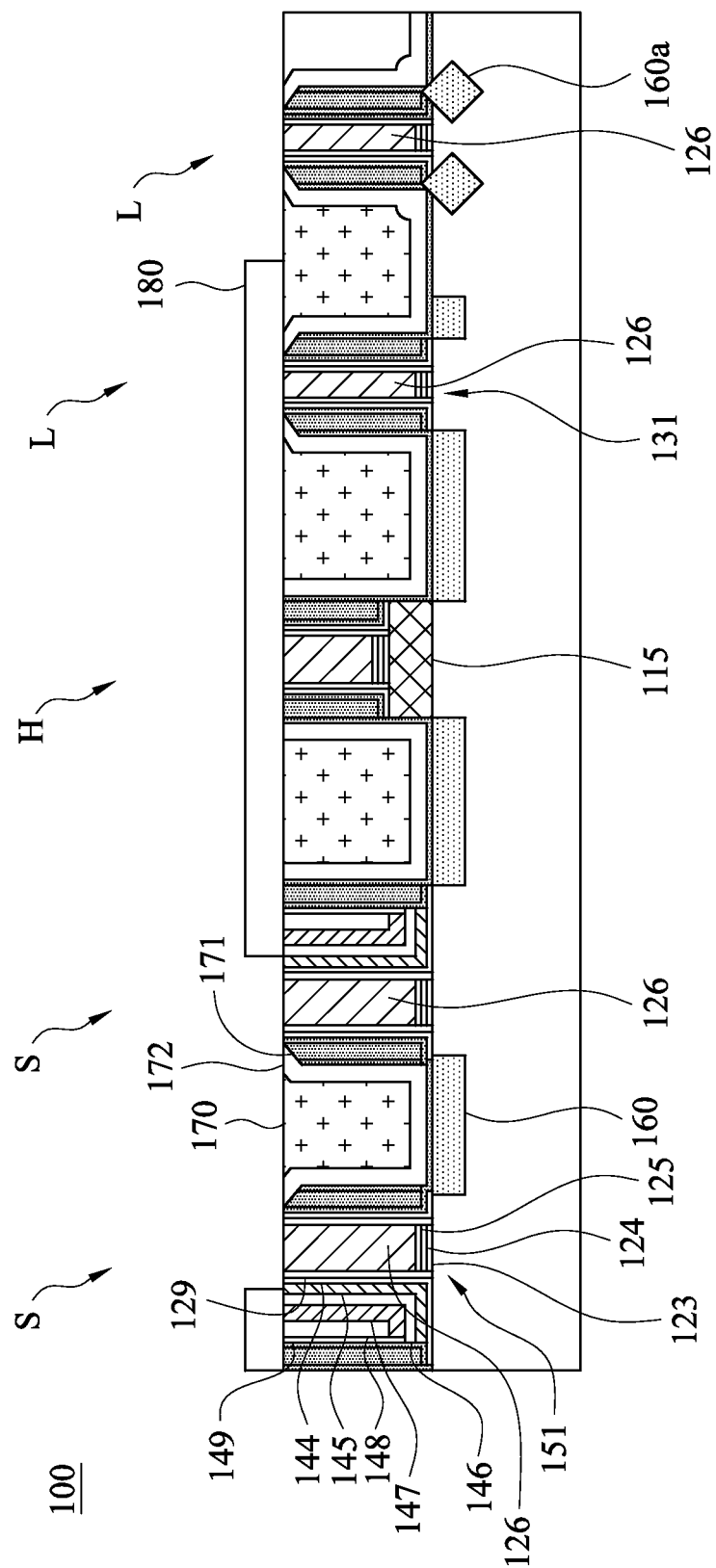
FIGS. 19-25 are cross-sectional views of intermediate steps in a replacement polysilicon gate (RPG) loop according to some embodiments of the present disclosure.

FIGS. 19-25 are cross-sectional views of intermediate steps in the RPG loop according to some embodiments of the present disclosure. As shown in FIG. 19, a photomask 180 is formed on or above the semiconductor device 100 of FIG. 19. The dummy gate layer 126 in at least one of the logic gate stacks L and the dummy gate layer 126 in at least one of the split gate stacks S are exposed by the photomask 180.

Figure 20:
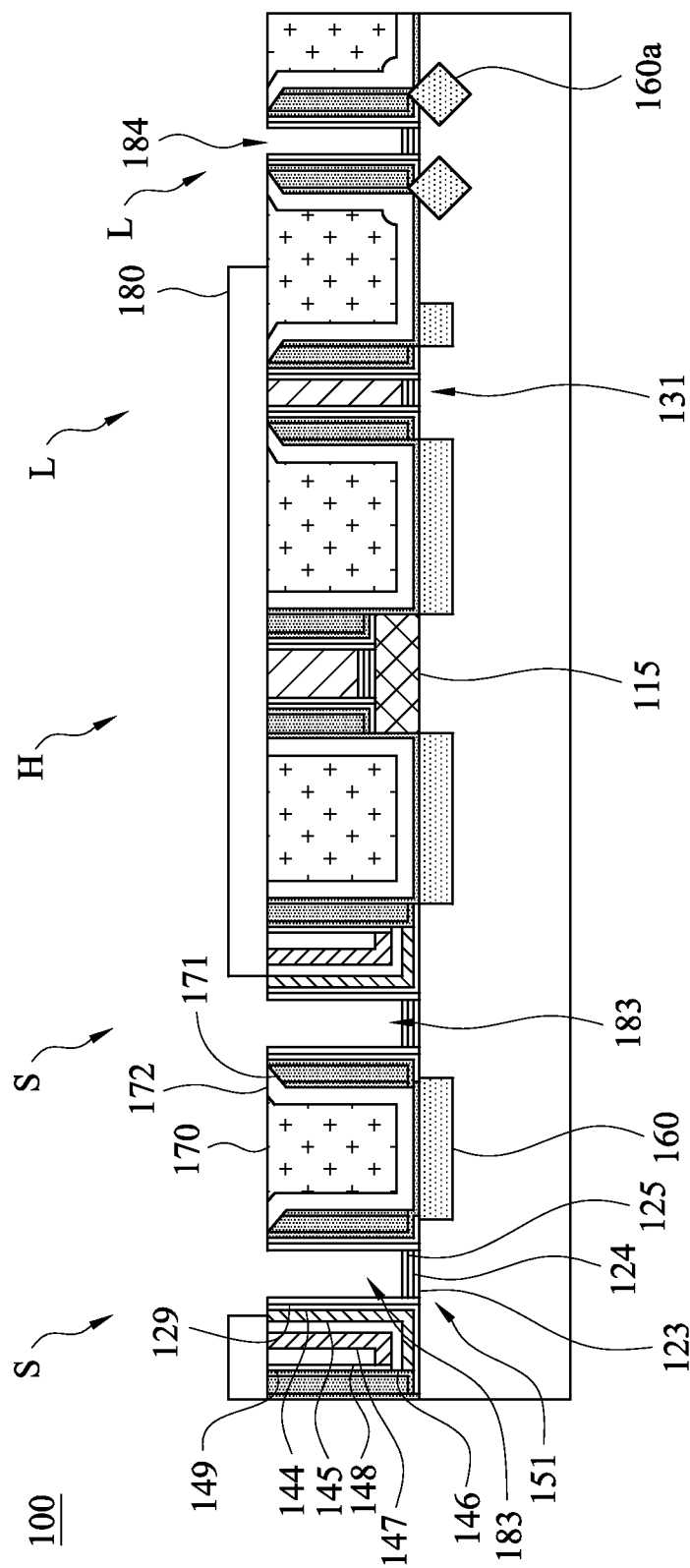

As shown in FIG. 19 and FIG. 20, the exposed dummy gate layers 126 are removed to form at least one select gate opening 183 in the split gate stacks S and at least one logic gate opening 184 in the logic gate stacks L.

Figure 21:
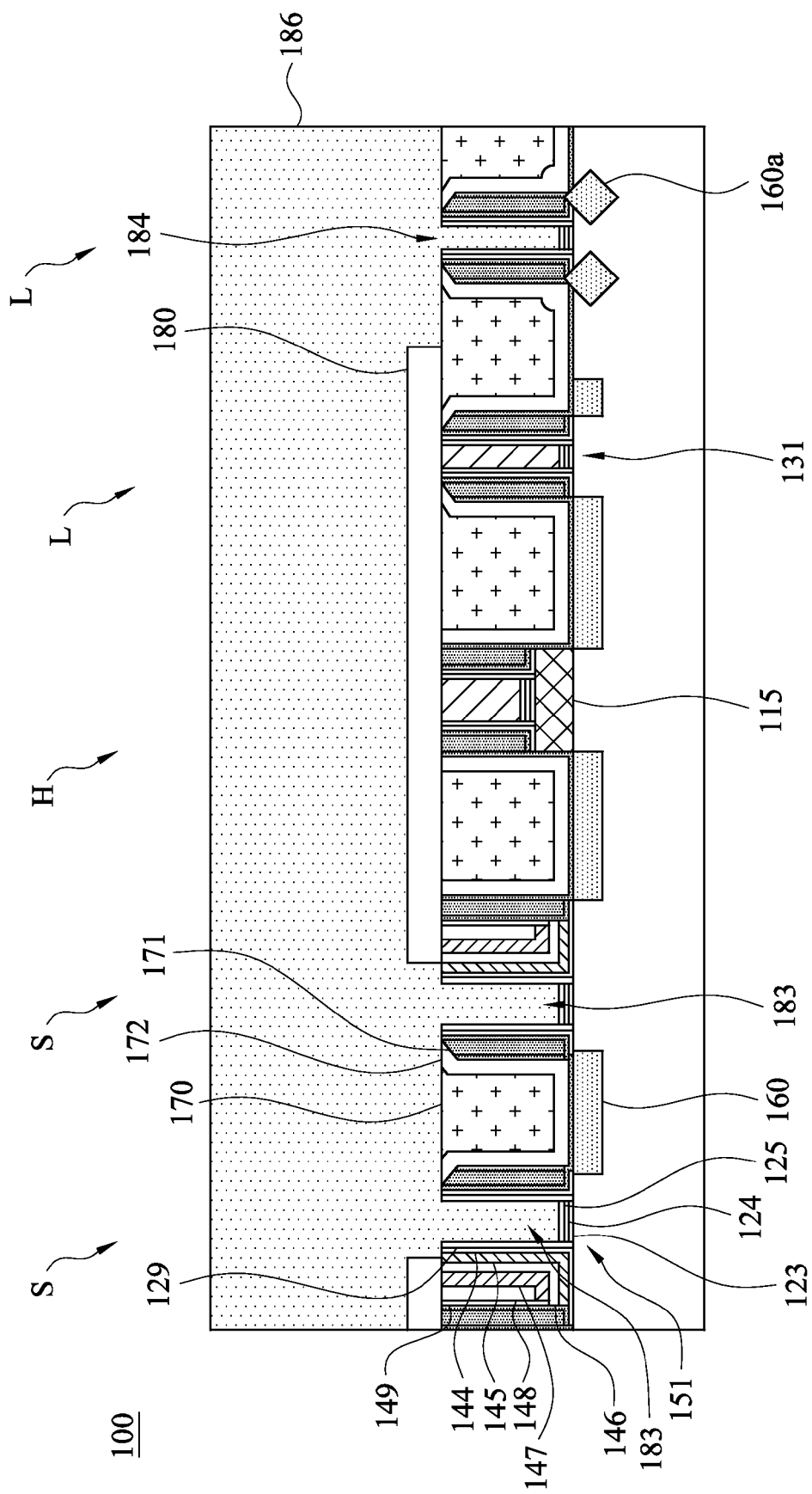

As shown in FIG. 21, a P-metal layer 186 is formed on or above the semiconductor device 100, such that the select gate opening 183 and the logic gate opening 184 are filled with the P-metal layer 186. Then, as shown in FIG. 22, the semiconductor device 100 is planarized, and the P-metal layer 186 outside the select gate opening 183 and the logic gate opening 184 are removed.

Figure 22:
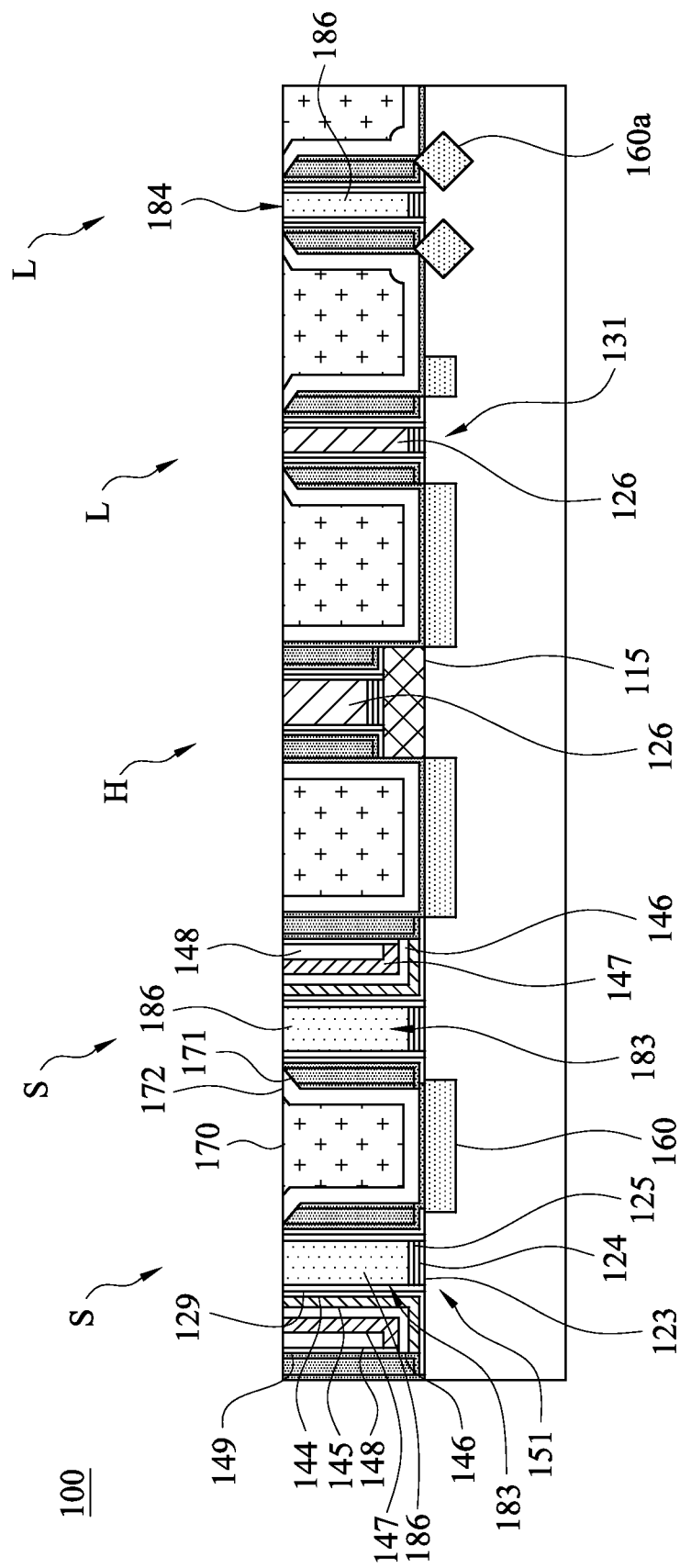
Figure 23:
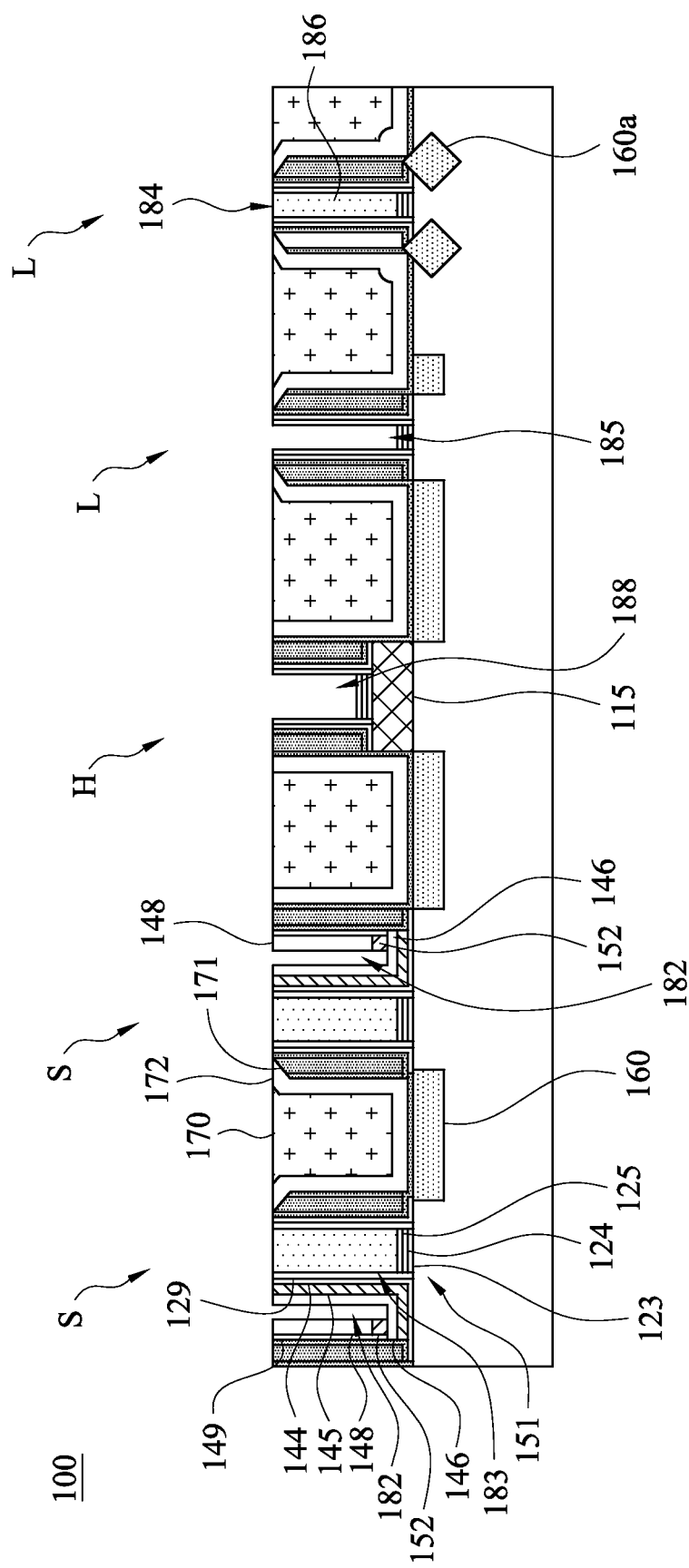

As shown in FIG. 22 and FIG. 23, the dummy gate layer 126 in at least one of the logic gate stacks L, a part of the main gate layer 147 in the split gate stacks S, and the dummy gate layer 126 in the high voltage device gate stack H are removed to form at least one main gate opening 182 in the split gate stacks S, at least one logic gate opening 185 in the logic gate stacks L, and at least one high voltage device gate opening 188 in the high voltage device gate stack H. Furthermore, since the part of the main gate layer 147 in the split gate stacks is removed by etching, a part of the main gate layer 147 remains between the spacer layer 148 and the blocking layer 146. The part of the main gate layer 147 remaining between the spacer layer 148 and the blocking layer 146 may be considered a silicon residue 152 when the main gate layer 147 is made of silicon.

Figure 24:
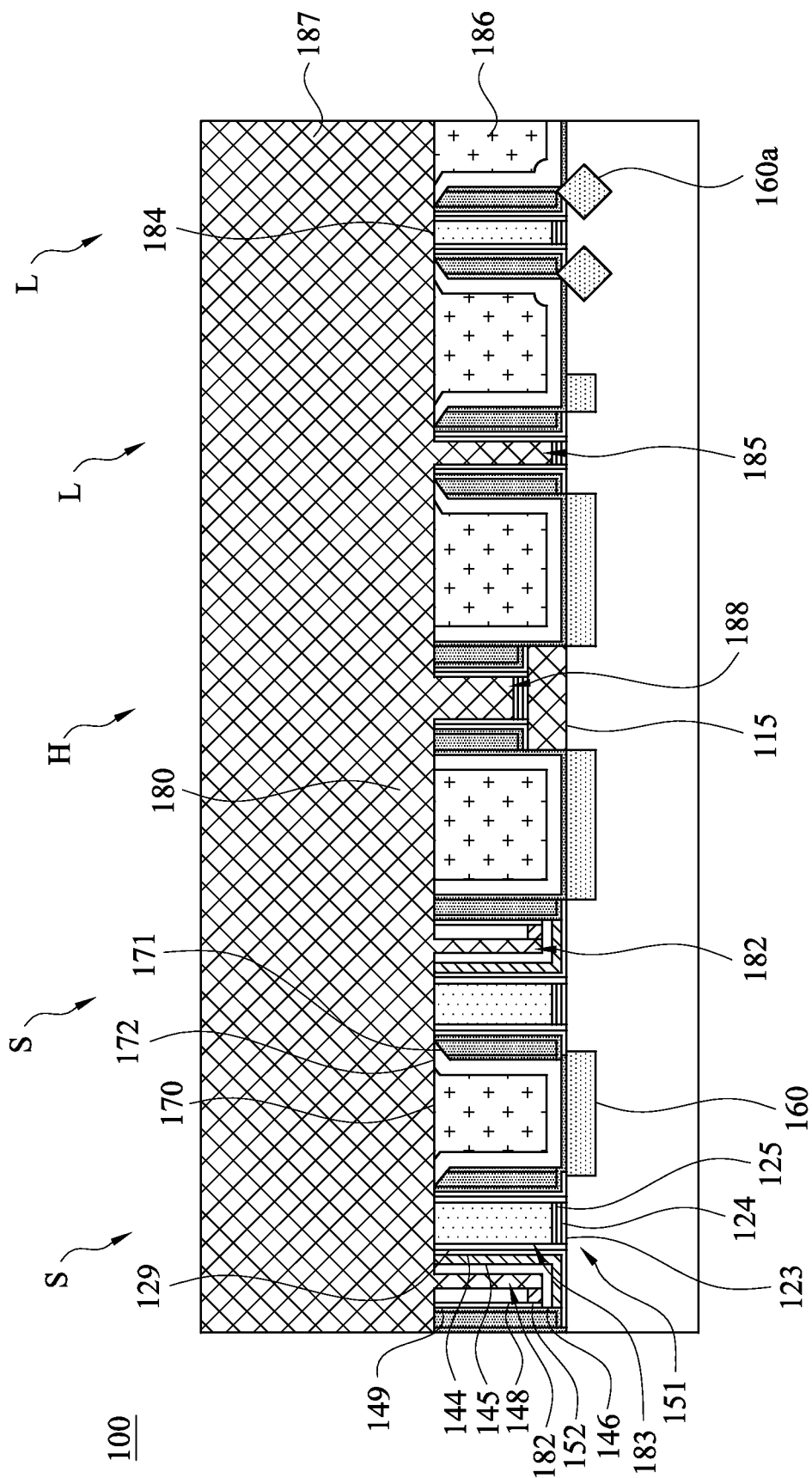
Figure 25:
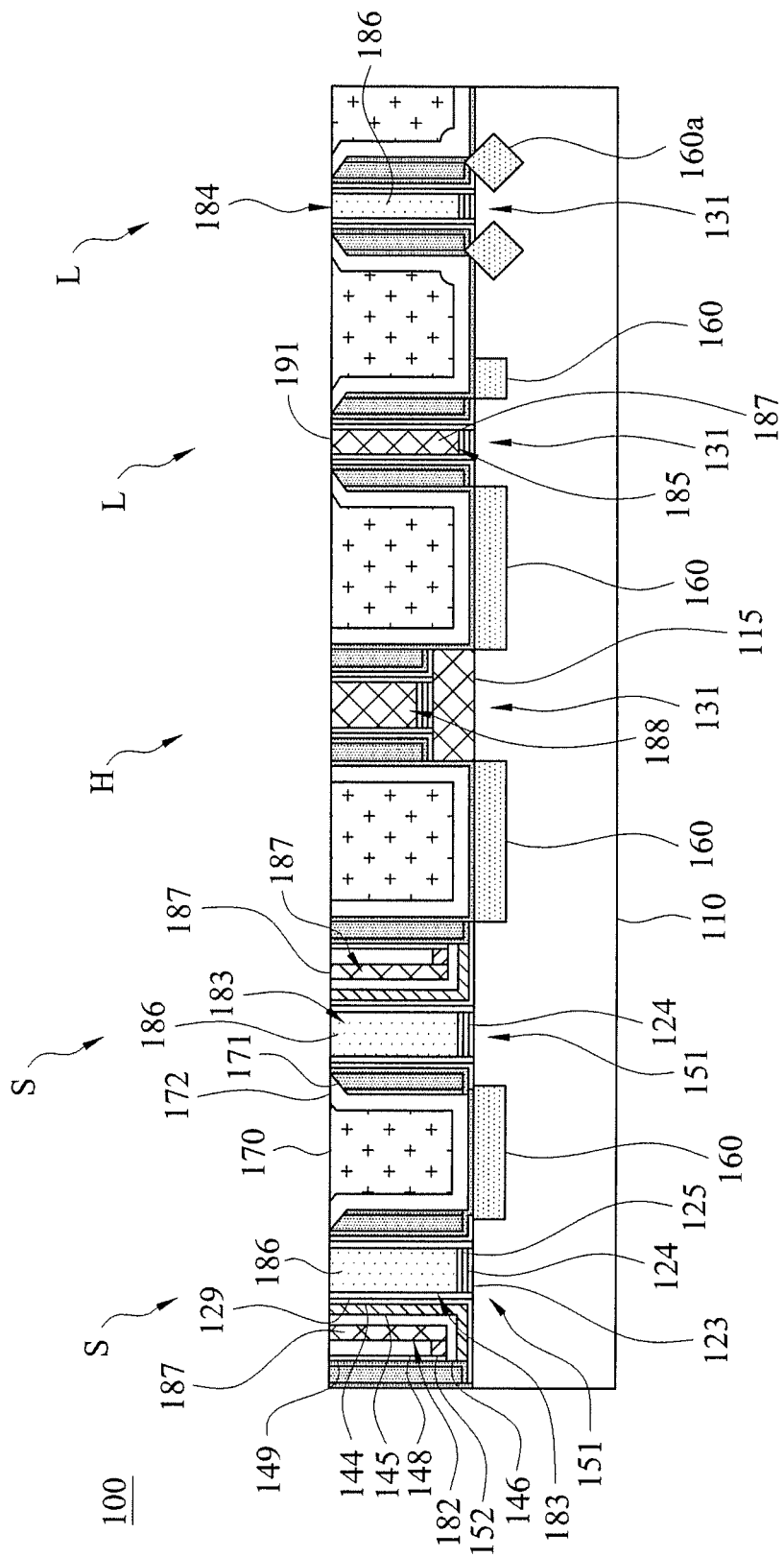

As shown in FIG. 24, an N-metal layer 187 is formed on or above the semiconductor device 100, such that the main gate opening 182, the logic gate opening 185, and the high voltage device gate opening 188 are filled with the N-metal layer 187. Then, as shown in FIG. 25, the semiconductor device 100 is planarized, and the N-metal layer 187 outside the main gate opening 182, the logic gate opening 185, and the high voltage device gate opening 188 are removed. Then, interconnect processes are performed. The detailed information about the interconnect processes is not described here.

As shown in FIG. 25, the split gate stacks S with the corresponding memory channels 151, sources and drains 160 can now be considered split gate memory devices. The logic gate stacks L with the corresponding logic channel 131, sources, and drains 160 can now be considered logic devices. The high voltage device gate stack H with the corresponding logic channel 131, sources, and drains 160 can now be considered a high voltage device. The P-metal layers 186 in the select gate openings 183 can be considered select gates, the N-metal layers 187 in the main gate openings 182 can be considered main gates, and the P-metal layer 186 and N-metal layers 187 in the logic gate openings 184 and 185 and the high voltage device gate opening 188 can be considered logic gates.

In FIG. 25, the rightmost logic device is a pMOSFET, and the select gates of the split gate memory devices and the logic gate of the rightmost logic device are made of P-metal. The second right logic device is a nMOSFET, and the main gates of the split gate memory devices and the logic gate of the second right logic device are made of N-metal.

As shown in FIG. 18 and FIG. 25, the high voltage device gate stack H with the corresponding logic channel 131 and drains 160 can be considered a high voltage device, and the high voltage device can be considered one of the logic devices. One of the split gate memory devices directly neighbors one of the logic devices.

As shown in FIG. 18 and FIG. 25, at least one of the split gate memory device includes the source and drain 160, the memory channel 151, and the split gate stack S. The source and drain 160 is disposed in the substrate 110. The memory channel 151 is disposed in the substrate 110 and between the source and drain 160. The split gate stack S is disposed above the memory channel 151.

Furthermore, the split gate stack S includes the select gate, i.e. the N-metal layer 187 of FIG. 18 or the P-metal layer 186 of FIG. 25 in the select gate opening 183, a select gate dielectric layer, i.e. the high-κ dielectric layer 124, the main gate, i.e. the P-metal layer 186 of FIG. 18 or the N-metal layer 187 of FIG. 25 in the main gate opening 182, the charge trapping layer 145, the tunneling layer 144, and the blocking layer 146. The select gate is disposed above a first part of the memory channel 151. The select gate dielectric layer is disposed between the select gate and the first part of the memory channel 151. The main gate is disposed above a second part of the memory channel 151. The charge trapping layer 145 is disposed between the main gate and the second part of the memory channel 151 and further between the main gate and the select gate. The tunneling layer 144 is disposed between the charge trapping layer 145 and the second part of the memory channel 151 and further between charge trapping layer 145 and the select gate. The blocking layer 146 is disposed between the charge trapping layer 145 and the main gate.

More specifically, the split gate stack S further includes a silicon residue 152. The silicon residue 152 is disposed on the blocking layer 146 and adjacent to a surface of the main gate facing away from the select gate.

As shown in FIG. 18 and FIG. 25, at least one of the logic devices includes the source and drain 160, the logic channel 131, and the logic gate stack L. The source and drain 160 are disposed in the substrate 110. The logic channel 131 is disposed in the substrate 110 and between the source and drain 160. The logic gate stack L is disposed above the logic channel 131.

By forming the split gate stack S and the logic gate stack L first and then performing the RPG loop, at least one of the dummy gate layer 126 and the main gate layer 147 in the split gate stack S and the dummy gate layer 126 in the logic gate stack L can be replaced with metal gates by using the same mask. Therefore, the masks used in the manufacturing method and the cost of the manufacturing method can be reduced compared to a sequential process, that is, respectively forming memory devices and logic devices. Furthermore, because the split gate stack S and the logic gate stack L can be formed in the same steps, a dummy structure between the split gate stack S and the logic gate stack L is not needed. Therefore, the space use efficiency can be enhanced, and the combination of the split gate memory device and the logic device can be further miniaturized.

According to some embodiments, a method for manufacturing the semiconductor device is provided. The method includes sequentially forming a dielectric layer and a dummy gate layer on a substrate, patterning the dielectric layer and the dummy gate layer to form a plurality of gate stacks on the substrate, sequentially forming a tunneling layer, a charge trapping layer, a blocking layer, and a main gate layer on the substrate, patterning the tunneling layer, the charge trapping layer, the blocking layer, and the main gate layer, such that the gate stacks become at least one split gate stack with the tunneling layer, the charge trapping layer, the blocking layer, and the main gate layer and at least one logic gate stack, forming sources and drains corresponding to the split gate stack and the logic gate stack, and respectively replacing at least one of the dummy gate layer and the main gate layer in the split gate stack and the dummy gate layer in the logic gate stack with at least one metal memory gate and at least one metal logic gate.

According to some embodiments, another method for manufacturing the semiconductor device is provided. The method includes sequentially forming a dielectric layer and a dummy gate layer on a substrate, patterning the dielectric layer and the dummy gate layer to form a plurality of gate stacks on the substrate, sequentially forming a tunneling layer, a charge trapping layer, a blocking layer, and a main gate layer on the substrate, patterning the tunneling layer, the charge trapping layer, the blocking layer, and the main gate layer, such that the gate stacks become at least one split gate stack with the tunneling layer, the charge trapping layer, the blocking layer, and the main gate layer and at least one logic gate stack, forming sources and drains corresponding to the split gate stack and the logic gate stack, removing at least one of the dummy gate layer and the main gate layer in the split gate stack and the dummy gate layer in the logic gate stack to form at least one memory gate opening in the split gate stack and at least one logic gate opening in the logic gate stack, and forming at least one metal memory gate in the memory gate opening and at least one metal logic gate in the logic gate opening.

According to some embodiments, a semiconductor device is provided. The semiconductor device includes a substrate, at least one split gate memory device, and at least one logic device. The split gate memory device is disposed on the substrate. The logic device is disposed on the substrate. At least one of a select gate and a main gate of the split gate memory device and a logic gate of the logic device are made of metal.

The reader's attention is directed to all papers and documents which are filed concurrently with his specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims herein is not intended to invoke the provisions of 35 U.S.C. §112, 6th paragraph.

What is claimed is:

1. A method for manufacturing a semiconductor device, the method comprising:
   sequentially forming a dielectric layer and a dummy gate layer on a substrate;
   patterning the dielectric layer and the dummy gate layer to form a plurality of gate stacks on the substrate;
   sequentially forming a tunneling layer, a charge trapping layer, a blocking layer, and a main gate layer on the substrate;
   patterning the tunneling layer, the charge trapping layer, the blocking layer, and the main gate layer, such that the gate stacks become at least one split gate stack with the tunneling layer, the charge trapping layer, the blocking layer, and the main gate layer and at least one logic gate stack;
   forming sources and drains corresponding to the split gate stack and the logic gate stack; and respectively replacing at least one of the dummy gate layer and the main gate layer in the split gate stack and the dummy gate layer in the logic gate stack with at least one metal memory gate and at least one metal logic gate.

2. The method of claim 1, wherein the replacing comprises:
   respectively replacing the dummy gate layer in the split gate stack and the dummy gate layer in the logic gate stack with a P-metal select gate and a P-metal logic gate.

3. The method of claim 1, wherein the replacing comprises:
   respectively replacing the main gate layer in the split gate stack and the dummy gate layer in the logic gate stack with a P-metal main gate and a P-metal logic gate.

4. The method of claim 1, wherein the replacing comprises:
   respectively replacing the dummy gate layer in the split gate stack and the dummy gate layer in the logic gate stack with a N-metal select gate and a N-metal logic gate.

5. The method of claim 1, wherein the replacing comprises:
   respectively replacing the main gate layer in the split gate stack and the dummy gate layer in the logic gate stack with a N-metal main gate and a N-metal logic gate.

6. The method of claim 1, further comprising:
   forming a high voltage oxide layer on the substrate, wherein patterning the dielectric layer and the dummy gate layer comprises:
   patterning the dielectric layer and the dummy gate layer to form at least one of the gate stacks on the high voltage oxide layer.

7. The method of claim 1, wherein the dielectric layer is a high-K dielectric layer.

8. A method for manufacturing a semiconductor device, the method comprising:
   sequentially forming a dielectric layer and a dummy gate layer on a substrate;
   patterning the dielectric layer and the dummy gate layer to form a plurality of gate stacks on the substrate;
   sequentially forming a tunneling layer, a charge trapping layer, a blocking layer, and a main gate layer on the substrate;
   patterning the tunneling layer, the charge trapping layer, the blocking layer, and the main gate layer, such that the gate stacks become at least one split gate stack with the tunneling layer, the charge trapping layer, the blocking layer, and the main gate layer and at least one logic gate stack;
   forming sources and drains corresponding to the split gate stack and the logic gate stack;
   removing at least one of the dummy gate layer and the main gate layer in the split gate stack and the dummy gate layer in the logic gate stack to form at least one memory gate opening in the split gate stack and at least one logic gate opening in the logic gate stack; and
   forming at least one metal memory gate in the memory gate opening and at least one metal logic gate in the logic gate opening.

9. The method of claim 8, wherein the metal memory gate and the metal logic gate are made of P-metal.

10. The method of claim 8, wherein the metal memory gate and the metal logic gate are made of N-metal.

11. A semiconductor device, comprising:
    a substrate;
    at least one split gate memory device disposed on the substrate, wherein a select gate of the split gate memory device is made of one of P-metal and N-metal, and a main gate of the split gate memory device is made of the other one of P-metal and N-metal; and at least one logic device disposed on the substrate, wherein a logic gate of the logic device is made of metal.

12. The semiconductor device of claim 11, wherein the logic device is a pMOSFET, and the select gate of the split gate memory device and the logic gate of the logic device are made of P-metal.

13. The semiconductor device of claim 11, wherein the logic device is a pMOSFET, and the main gate of the split gate memory device and the logic gate of the logic device are made of P-metal.

14. The semiconductor device of claim 11, wherein the logic device is an nMOSFET, and the select gate of the split gate memory device and the logic gate of the logic device are made of N-metal.

15. The semiconductor device of claim 11, wherein the logic device is an nMOSFET, and the main gate of the split gate memory device and the logic gate of the logic device are made of N-metal.

16. The semiconductor device of claim 11, wherein the logic device is a high voltage device.

17. The semiconductor device of claim 11, wherein a select gate dielectric layer of the split gate memory device is made of a high-K dielectric material.

18. The semiconductor device of claim 11, wherein a logic gate dielectric layer of the logic device is made of a high-K dielectric material.

19. The semiconductor device of claim 11, wherein the split gate memory device directly neighbors the logic device.

20. The semiconductor device of claim 11, wherein the split gate memory device comprises:

a source in the substrate;

a drain in the substrate;

a memory channel in the substrate and between the source and the drain;

the select gate disposed above a first part of the memory channel;

a select gate dielectric layer disposed between the select gate and the first part of the memory channel;

the main gate disposed above a second part of the memory channel;

a charge trapping layer disposed between the main gate and the second part of the memory channel and further between the main gate and the select gate;

a tunneling layer disposed between the charge trapping layer and the second part of the memory channel and further between the charge trapping layer and the select gate;

a blocking layer disposed between the charge trapping layer and the main gate;

a silicon residue disposed on the blocking layer and adjacent to a surface of the main gate facing away from the select gate.

* * * * *